United States Patent
Nagano et al.

[19]

[11] Patent Number: 6,130,565
[45] Date of Patent: Oct. 10, 2000

[54] CHARGE PUMP CIRCUIT, PLL CIRCUIT, AND PULSE-WIDTH MODULATION CIRCUIT

[75] Inventors: Hideo Nagano; Kenji Kanoh, both of Tokyo, Japan

[73] Assignee: Mitsubishi Denki Kabushiki Kaisha, Tokyo, Japan

[21] Appl. No.: 09/160,573

[22] Filed: Sep. 25, 1998

[30] Foreign Application Priority Data

Mar. 24, 1998 [JP] Japan .................................. 10-075632

[51] Int. Cl.$^7$ ........................................................ G05F 1/10
[52] U.S. Cl. .................................. 327/157; 327/157
[58] Field of Search ........................................ 327/536, 537, 327/534, 535, 148, 157, 53, 66; 323/315; 330/288

[56] References Cited

U.S. PATENT DOCUMENTS

| | | | |
|---|---|---|---|
| 4,697,112 | 9/1987 | Ohtani et al. | 327/53 |
| 4,897,596 | 1/1990 | Hughes et al. | 323/315 |
| 5,012,133 | 4/1991 | Hughes | 327/91 |
| 5,103,123 | 4/1992 | McGinn | 327/3 |
| 5,371,476 | 12/1994 | Nishioka | 330/255 |
| 5,525,927 | 6/1996 | Yung et al. | 327/543 |
| 5,812,022 | 9/1998 | Hirano et al. | 327/563 |

FOREIGN PATENT DOCUMENTS

| | | |
|---|---|---|
| 59-146203 | 8/1984 | Japan . |
| 63-126318 | 5/1988 | Japan . |
| 4207320 | 7/1992 | Japan . |
| 8-130465 | 6/1996 | Japan . |
| 8-148983 | 6/1996 | Japan . |

*Primary Examiner*—Terry D. Cunningham
*Assistant Examiner*—Hai L. Nguyen
*Attorney, Agent, or Firm*—Leydig, Voit & Mayer, Ltd.

[57] ABSTRACT

There is described a charge pump circuit capable of minimizing an offset in a phase difference at the time of zero output current, which would otherwise be caused by variations in elements stemming from variations in a manufacturing process. When a first input signal becomes low, a first MOS transistor is brought into conduction, and an electric current "I1" specified by a second MOS transistor flows to an output node as a charge current. When a second input signal becomes low, a third MOS transistor is brought into conduction, and an electric current "I2" specified by a fourth MOS transistor flows to a current mirror circuit. The current mirror circuit withdraws an electric current "I6"—which is the same as that of the electric current "I2"—from the output node as a discharge current. When the charge or discharge current flows to the output node, there is output an electric current of zero. If there is only the charge current, the charge current flows from the output node. In contrast, if there is only the discharge current, the discharge current is withdrawn from the output node.

19 Claims, 16 Drawing Sheets

FIG. 3A REF. CLOCK
FIG. 3B COMP. CLOCK
FIG. 3C FIRST INPUT (UP SIGNAL)
FIG. 3D CHARGE CURRENT I1
FIG. 3E SECOND INPUT (DOWN SIGNAL)
FIG. 3F DISCHARGE CURRENT I6
FIG. 3G OUTPUT CURRENT I

FIG. 4A REF. CLOCK
FIG. 4B COMP. CLOCK
FIG. 4C FIRST INPUT (UP SIGNAL)
FIG. 4D CHARGE CURRENT I1
FIG. 4E SECOND INPUT (DOWN SIGNAL)
FIG. 4F DISCHARGE CURRENT I6
FIG. 4G OUTPUT CURRENT I

FIG. 9A REF. CLOCK
FIG. 9B COMP. CLOCK
FIG. 9C FIRST INPUT (UP SIGNAL)
FIG. 9D CHARGE CURRENT I1
FIG. 9E SECOND INPUT (DOWN SIGNAL)
FIG. 9F DISCHARGE CURRENT I6
FIG. 9G OUTPUT CURRENT I

CHARGE PUMP CIRCUIT, PLL CIRCUIT, AND PULSE-WIDTH MODULATION CIRCUIT

BACKGROUND OF THE INVENTION

1. Field of the Invention

The present invention generally related to a charge pump circuit for generating a charge current and a discharge current, and more particularly, to a charge pump circuit which is used as a charge/discharge current generation circuit in a PLL (Phase-Locked Loop) circuit, to a PLL circuit, and to a pulse-width modulation (PWM) circuit which utilizes the PLL circuit.

2. Background Art

FIG. 21 shows a conventionally-known charge pump circuit to be used with a PLL circuit.

In FIG. 21, reference numeral 200 designates a phase-difference comparison circuit which produces an "UP" and "DOWN" signal on the basis of a phase difference between the reference clock signal and a clock signal to be compared, and 100 designates a charge pump circuit which outputs a charge or discharge current to a low-pass filter upon receipt of the "UP" and "DOWN" signal from the phase-difference comparison circuit.

The charge pump circuit 100 comprises an inverter circuit "In", a P-type MOS transistor "Tp", and an N-type MOS transistor "Tn". The inverter circuit "In" inverts an "UP" signal received from the phase-difference comparison circuit 200. The transistor "Tp" is connected between a supply voltage node to which a supply voltage (Vcc) is applied and an output node which outputs a charge or discharge current. The gate electrode of the transistor "Tp" receives the "UP" signal that is inverted by the inverter circuit "In". In contrast, the transistor "Tn" is connected between a ground potential node to which a ground potential is applied and the output node. The gate electrode of the transistor "Tn" receives the "DOWN" signal from the phase-difference comparison circuit 200.

With the foregoing configuration, the phase-difference comparison circuit 200 outputs an "UP" and "DOWN" signal on the basis of the phase difference between the reference clock signal and a clock signal to be compared.

When the phase-difference comparison circuit 200 outputs a high-level pulse signal as an "UP" signal, the pulse signal is inverted to a low-level pulse signal by the inverter circuit "In" and is input to the transistor "Tp". Upon receipt of the low-level pulse signal, the transistor "Tp" is brought into conduction, so that a charge current "i1" is output from the output node.

In contrast, when the phase-difference comparison circuit 200 outputs a high-level pulse signal as a "DOWN" signal, the high-level pulse signal is applied to the transistor "Tn". Upon receipt of the high-level pulse signal, the transistor "Tn" is brought into conduction, so that a discharge current "i2" is output from the output node.

In this way, the charge current "i1" or the discharge current "i2" is output from the output node.

In the charge pump circuit having the foregoing configuration, in order to prevent a dead band being formed, when there is no phase difference between the reference clock signal and a clock signal to be compared, the phase-difference comparison circuit 200 outputs the "UP" and "DOWN" signals in the form of a high-level pulse signal for a short period of time within one cycle of the reference clock signal. When the charge pump circuit 100 receives the "UP" and "DOWN" signals having high-level, both the transistors "Tp" and "Tn" are brought into conduction, so that the charge current "i1" and the discharge current "i2" flow through the transistors.

At this time, so long as the transistors "Tp" and "Tn" are designed in such a way that the charge current "i1" and the discharge current "i2" are the same value, the charge current output from the output node to the low-pass filter or the discharge current output from the low-pass filter to the output node, namely, the output current of the charge pump circuit 100 becomes zero. In short, so long as the transistors "Tp" and "Tn" are designed in such a way discussed above, the output current becomes zero when the phase difference between the reference clock signal and a clock signal to be compared is zero as depicted by line A provided in FIG. 22.

In FIG. 22, the horizontal axis represents a phase difference between the reference clock signal and a clock signal to be compared, and the vertical axis represents an output current which includes a mean current output from or received by the output node during one cycle of the reference clock signal. The area where the phase difference takes a positive value exhibits a situation where the clock signal to be compared leads the reference clock signal. In contrast, the area where the phase difference takes a negative value exhibits a situation where the clock signal lags behind the reference clock signal. Further, the area where the output current takes a positive value exhibits a situation where a charge current is output to the low-pass filter from the output node. In contrast, the area where the output current takes a negative value exhibits a situation where a discharge current flows into the output node from the low-pass filter.

However, even if the transistors "Tp" and "Tn" are designed in such a way that output currents from the transistors become zero when the phase difference between the reference clock signal and a clock signal to be compared is zero, the transistors "Tp" and "Tn" may vary from their design values because of variations in manufacturing processes.

For example, if the channel length of the transistors "Tp" and "Tn" becomes shorter than a design value, an electric current flowing through the transistors "Tp" and "Tn" when the transistors are in conduction becomes greater than an electric current which would otherwise flow through the transistors if the transistors were designed in accordance with the design value. Generally, in this case, the transistor "Tp" makes the current grater with a higher ratio than the transistor "Tn" does. In short, when the transistors "Tp" and "Tn" are in conduction, the current flowing through the transistor "Tp" becomes greater than that flowing through the transistor "Tn". As a result, as depicted by line B provided in FIG. 22, an output current (or a charge current) flows through the output node when the phase difference between the reference clock signal and a clock signal to be compared is zero, and the output current becomes zero when the clock signal to be compared lags behind the reference clock signal by the offset width W1.

In contrast, if the channel length of the transistors "Tp" and "Tn" becomes longer than a design value, an electric current flowing through the transistors "Tp" and "Tn" when the transistors are in conduction becomes smaller than an electric current which would otherwise flow through the transistors if the transistors were designed in accordance with the design value. Generally, in this case, the transistor "Tp" makes the current smaller with a higher ratio than the transistor "Tn" does. In short, when the transistors "Tp" and "Tn" are in conduction, the current flowing through the transistor "Tp" becomes smaller than that flowing through the transistor "Tn". As a result, as depicted by line C provided in FIG. 22, an output current (or a discharge current) flows through the output node when the phase difference between the reference clock signal and a clock signal to be compared is zero, and the output current becomes zero when the clock signal to be compared leads the reference clock signal by the offset width W2.

Relative to the supply voltage (Vcc) applied to the supply voltage node, characteristics of the charge pump circuit 100 must be compensated for within a certain range of supply voltage. When the charge pump circuit is used in a condition where the supply voltage is higher or lower than a specified value, the characteristics of the charge pump circuit 100 depicted by line A provided in FIG. 22 shift toward the line B or the line C, so that the offset of the phase difference is provided.

Relative to the operating temperature of the charge pump circuit 100, the characteristics of the charge pump circuit 100 must be compensated for within a range of, e.g., 0 to 70° C. Depending on the operating temperature, the characteristics of the circuit 100 depicted by line A provided in FIG. 22 shift toward the line B or C, so that the offset of the phase difference is provided as well.

As mentioned above, the offset of the phase difference corresponding to the zero output current is provided because of variations in the processes of manufacture of the transistors "Tp" and "Tn", of variations in the supply voltage (Vcc) applied to the supply voltage node, and of variations in the operating temperature.

In a case where the foregoing charge pump circuit 100 is used with a PLL circuit, the presence of such an offset signifies that a phase difference constantly arises in a steady state in which the PLL circuit is locked. In short, the presence of such an offset signifies a lag in a timing of the output from the PLL circuit, eliminating a margin of timing design.

Such an offset poses little problem for a charge pump circuit which operates at a PLL circuit at low speed, or a charge pump circuit using the low-frequency reference clock signal and a low-frequency clock signal to be compared. In contrast, in the case of a charge pump circuit which operates at high speed, or a charge pump circuit using the high-frequency reference clock signal and a high-frequency clock signal to be compared, the offset eliminates a margin of timing design, thus posing a very serious problem.

SUMMARY OF THE INVENTION

It is a general object of the present invention to provide a novel and useful charge pump circuit, a novel and useful PLL circuit, and a novel and useful pulse-width modulation circuit.

A more specific object of the present invention is to provide a charge pump circuit which is capable of minimizing an offset in a phase difference at the time of zero output current, without regard to variations in elements due to variations in a manufacturing process, variations in a supply voltage (Vcc) applied to a supply voltage node, or variations in the operating temperature.

A second object of the present invention is to provide a PLL circuit which has a margin of timing design.

A third object of the present invention is to provide a pulse-width modulation circuit which modulates the width of a pulse signal with a high degree of accuracy.

The first objects of the present invention is achieved by a charge pump circuit having a configuration described below.

The charge pump circuit comprises a charge current generation circuit and a discharge current generation circuit. The charge current generation circuit includes a supply voltage node to which a supply voltage is applied, a ground potential node to which a ground potential is applied, a first input node for receiving a first input signal, a second input node for receiving a second input signal, and an output node through which the charge or discharge current flows.

The charge current generation circuit includes a first MOS transistor of a first conductivity type. The first MOS transistor is connected at the gate electrode thereof to the first input node and at the source electrode thereof to said supply voltage node. The charge current generation circuit also include a second MOS transistor of a first conductivity type. The second MOS transistor receives at the gate electrode thereof a first predetermined electric potential and which is connected between the drain electrode of the first MOS transistor and the output node.

The discharge current generation circuit includes a third MOS transistor of a first conductivity type. The third MOS transistor is connected at the gate electrode thereof to the second input node and at the source electrode thereof to the supply voltage node. The discharge current generation circuit include a fourth MOS transistor of a first conductivity type. The fourth MOS transistor is connected at the gate electrode thereof to the gate electrode of the second MOS transistor and at the source electrode thereof to the drain electrode of the third MOS transistor. The discharge current generator circuit also includes a current mirror circuit having input circuitry and output circuitry. The input circuitry is connected to the drain electrode of the fourth MOS transistor and through which an input current flows. The output circuitry is connected to the output node and through which flows an output current corresponding to the input current flowing through the input circuitry.

The second object of the present invention is achieved by a PLL circuit having a configure described below. The PLL circuit includes a phase-difference comparison circuit which outputs an "UP" or "DOWN" signal on the basis of a phase difference between a reference clock signal and a clock signal to be compared. The PLL circuit includes a charge pump circuit which receives the "UP" or "DOWN" signal from the phase-difference comparison circuit and outputs a charge or discharge current. The PLL circuit includes a low-pass filter which outputs a control voltage according to an output from the charge pump circuit. The PLL circuit includes a voltage-controlled oscillation circuit which outputs a clock signal controlled by the control voltage received from the low-pass filter to the phase-difference comparison circuit as a clock signal to be compared.

The charge pump circuit includes a first input node for receiving the "UP" signal from the phase-difference comparison circuit, a second input node for receiving the "DOWN" signal from said phase-difference comparison circuit, an output node connected to an input node of the low-pass filter. The charge pump circuit also includes a first MOS transistor of a first conductivity type which is connected at the gate electrode thereof to the first input node and at the source electrode thereof to a supply voltage node having a supply voltage applied thereto, a second MOS transistor of a first conductivity type which receives at the gate electrode thereof a given electric potential and which is connected between the drain electrode of the first MOS transistor and said output node, a third MOS transistor of a first conductivity type which is connected at the gate electrode thereof to the second input node and at the source electrode thereof to the supply voltage node, and a fourth MOS transistor of a first conductivity type which is connected at the gate electrode thereof to the gate electrode of the second MOS transistor and at the source electrode thereof to the drain electrode of the third MOS transistor. The pump circuit further includes a current mirror circuit having input circuitry which is connected to the drain electrode of the fourth MOS transistor and through which an input current flows, as well as output circuitry which is connected to said output node and through which flows an output current corresponding to the input current flowing through said input circuit.

The third object of the present invention is achieved be a pulse-width modulation circuit having a configuration described below. The pulse-width modulation circuit includes a waveform generation circuit and a waveform selection circuit. The waveform generation circuit receives an input clock signal and outputs, on the basis of the thus-received input clock signal, a plurality of clock signals for selection purposes which are out of phase with one another by a given offset. The waveform selection circuit receives the plurality of clock signals from the waveform generation circuit and a selection signal, selects two clock signals for selection purposes from the plurality of clock signals on the basis of the received selection signal, and subjects the selected two clock signals for selection purposes to AND operation. Further, the waveform selection circuit outputs the result of such AND operation as a pulse-width modulated output signal.

The waveform generation circuit includes a preceding stage PLL circuit which outputs a plurality of out-of-phase clock signals, each being out of phase with the input clock signal by a given offset, a frequency division circuit which outputs a frequency-divided clock signal by dividing the frequency of the input clock signal, a subsequent stage PLL circuit which receives the frequency-divided clock signal from the frequency division circuit and outputs a delay time setting voltage signal, and selection clock signal generation circuits which are provided so as to respectively correspond to the plurality of out-of-phase clock signals received from the preceding stage PLL circuit and which output to the waveform selection circuit the plurality of clock signals for selection purpose by delaying the corresponding out-of-phase clock signals at a given time interval, on the basis of the delay time setting voltage signal from said subsequent stage PLL circuit.

The preceding stage PLL circuit includes a phase-difference comparison circuit which outputs an "UP" or "DOWN" signal on the basis of a phase difference between the reference clock signal and a clock signal to be compared, a charge pump circuit which receives the "UP" or "DOWN" signal from said phase-difference comparison circuit and outputs a charge or discharge current, a low-pass filter which outputs a control voltage according to an output from the charge pump circuit, and a voltage-controlled oscillation circuit which is controlled by the control voltage received from said low-pass filter, which outputs to the phase-difference comparison circuit the reference clock signal and the clock signal to be compared, the two signals being out of phase with each other by one cycle, and which outputs said plurality of out-of-phase clock signals.

The charge pump circuit includes a first input node for receiving the "UP" signal from the phase-difference comparison circuit, a second input node for receiving the "DOWN" signal from the phase-difference comparison circuit, an output node connected to an input node of said low-pass filter, a first MOS transistor of a first conductivity type which is connected at the gate electrode thereof to said first input node and at the source electrode thereof to a supply voltage node having a supply voltage applied thereto, a second MOS transistor of a first conductivity type which receives at the gate electrode thereof a given electric potential and which is connected between the drain electrode of said first MOS transistor and said output node, a third MOS transistor of a first conductivity type which is connected at the gate electrode thereof to said second input node and at the source electrode thereof to said supply voltage node, a fourth MOS transistor of a first conductivity type which is connected at the gate electrode thereof to the gate electrode of said second MOS transistor and at the source electrode thereof to the drain electrode of said third MOS transistor, and a current mirror circuit having input circuitry which is connected to the drain electrode of said fourth MOS transistor and through which an input current flows, as well as output circuitry which is connected to said output node and through which an output current corresponding to the input current flowing through said input circuit flows.

The voltage-controlled oscillation circuit includes a voltage control circuit which receives a control voltage from said low-pass filter and which outputs the delay time setting voltage signal, and a plurality of cascaded delay means which are controlled by the delay time setting voltage signal received from the voltage control circuit. Delay means in a first stage receives the input clock signal. Outputs from the plurality of delay means are output as the plurality of out-of-phase clock signals. Two delay means of the plurality of delay means output to the phase-difference comparison circuit, as the reference clock signal and the clock signal to be compared, which clock signals being out of phase one cycle with each other.

Other objects and further features of the present invention will be apparent from the following detailed description when read in conjunction with the accompanying drawings.

DESCRIPTION OF THE PREFERRED EMBODIMENTS

In the following, principles and embodiments of the present invention will be described with reference to the accompanying drawings.

First Embodiment

Figure 1:
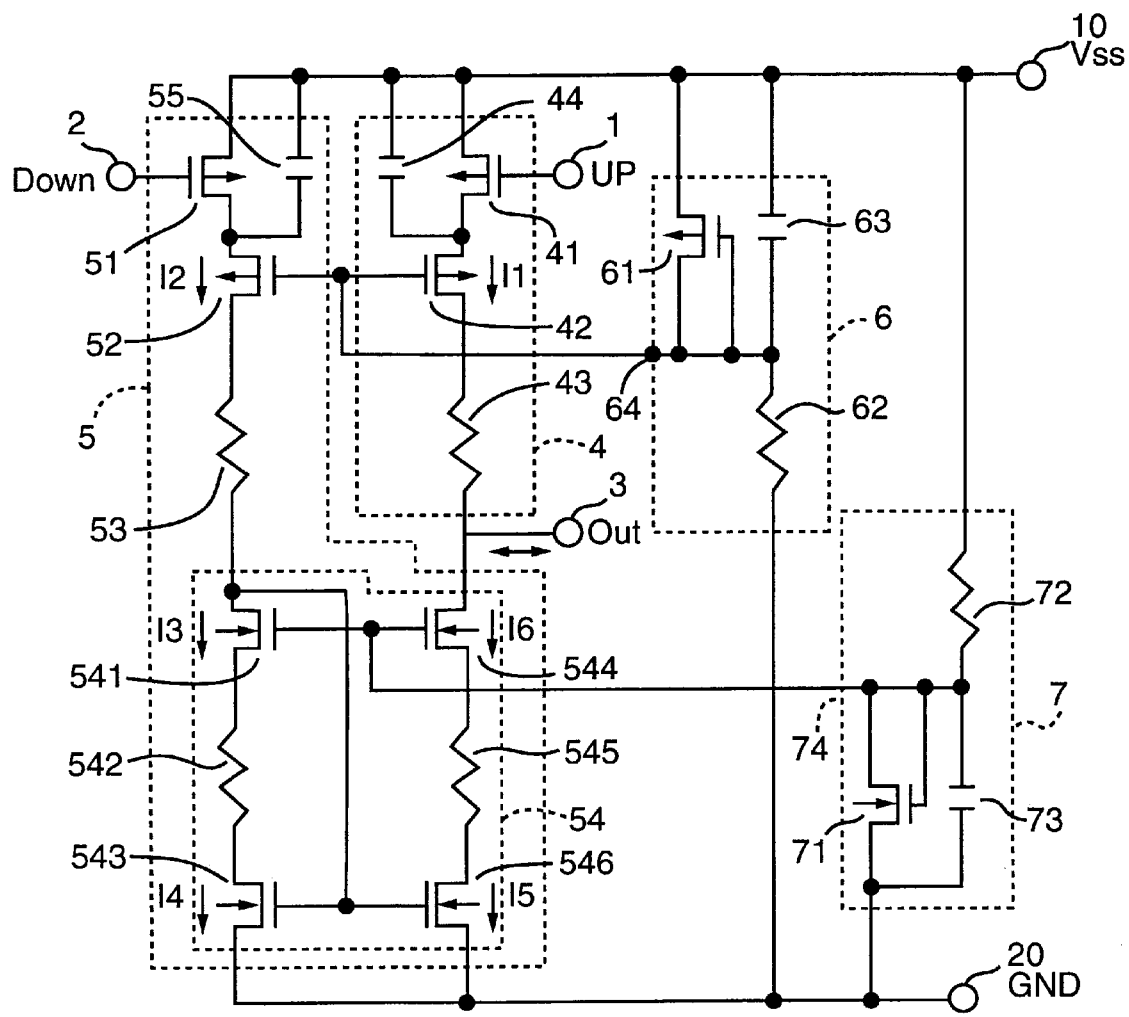
FIG. 1 is a schematic diagram showing a charge pump circuit which serves as charge/discharge current generation circuit according to a first embodiment of the present invention.

FIG. 1 shows a charge pump circuit comprising a charge/discharge current generation circuit according to a first embodiment of the present invention. In the drawing, reference numeral 1 designates a first input node for receiving a first input signal which serves as an "UP" signal; 2 designates a second node for receiving a second input signal which serves as a "DOWN" signal; and 3 designates an output node for permitting flow of an output current "I" which will become a charge current or a discharge current.

Reference numeral 4 designates a charge current generation circuit for causing a charge current to flow to the output node 3. The charge current generation circuit 4 comprises a first P-type MOS transistor 41, a second P-type MOS transistor 42, a first resistive element 43, and a first capacitive element 44.

The first MOS transistor 41 is connected at its gate electrode to the first input node 1 and is connected at its source electrode to a supply voltage node 10. In the first embodiment, 3.3 V is applied to the supply voltage node 10 as a supply voltage (Vcc). Further, in the first embodiment, the first MOS transistor 41 has a slightly longer channel than the minimum channel length and a higher electric current capacity, whereby the sensitivity thereof to an input signal is improved. The minimum channel length signifies the minimum line width determined by a design rule which is applied to a semiconductor integrated circuit device in which the charge pump circuit is integrated. In a case where a 0.5 μm design rule is applied, the minimum line width signifies 0.5 μm. The first MOS transistor 41 according to the first embodiment is designed so as to have a threshold voltage of 0.7 V.

The second MOS transistor 42 is connected at its source electrode to the drain electrode of the first MOS transistor 41, and receives a first given electric potential at its gate electrode. In the first embodiment, the first given electric potential is set to 2.2 V. The second MOS transistor 42 specifies (or stabilizes) an electric current flowing through the first MOS transistor 41 when the transistor 41 is in conduction. In the first embodiment, the channel length of the second MOS transistor 42 is set so as to become slightly longer than that of the first MOS transistor 41. As a result of the channel length of the second MOS transistor 42 being made longer than that of the first MOS transistor 41, the Early effect of the second MOS transistor 42 can be reduced. In short, the configuration of the channel decreases variations in a source-drain electric current ("IDS"="I1") stemming from variations in a source-drain voltage (VDS) of the second MOS transistor 42. Accordingly, even if the supply voltage Vcc applied to the supply voltage node 10 somewhat changes from a specified value within a range of compensation values, for example, the electric current "I1" that flows through the first and second MOS transistors 41, 42 when the first MOS transistor 41 is in conduction substantially matches the specified value. In the first embodiment, the threshold voltage of the second MOS transistor 42 is set to 0.7 V.

The first resistive element 43 is connected between the drain electrode of the second MOS transistor 42 and the output node 3. The first capacitive element 44 is connected between the supply voltage node 10 and the drain electrode of the first MOS transistor 41. The first capacitive element 44 is provided so as to absorb the noise superimposed on a power line or the like connected to the supply voltage node 10. In the first embodiment, the first capacitive element 44 is formed from a MOS capacitor having a P-type MOS transistor configuration and has a capacitance of 2 pF.

Reference numeral 5 designates a discharge current generation circuit for withdrawing a discharge current from the output node 3. This discharge current generation circuit 5 comprises a third P-type MOS transistor 51, a fourth P-type MOS transistor 52, a second resistive element 53, a current mirror circuit 54 having characteristics analogous to those of a Wilson-type current mirror circuit, and a second capacitive element 55.

A third MOS transistor 51 is connected at its gate electrode to a second input node 2 and at its source electrode to the supply voltage node 10. The third MOS transistor 51 is formed so as to become equal in size to the first MOS transistor 41, more specifically, to have the same channel length and channel width as those of the MOS transistor 41. Further, the third MOS transistor 51 is formed so as to have the same transistor characteristics as those of the MOS transistor 41.

The fourth MOS transistor 52 is connected at its source electrode to the drain electrode of the third MOS transistor 51, and receives the first given electric potential applied to its gate electrode. The fourth MOS transistor 52 specifies (or stabilizes) an electric current flowing through the third MOS transistor 51 when the transistor 51 is in conduction. In the first embodiment, the channel length of the fourth MOS transistor 52 is set so as to become slightly longer than that of the third MOS transistor 51. As a result of the channel length of the fourth MOS transistor 52 being made longer than that of the third MOS transistor 51, the Early effect of the fourth MOS transistor 52 can be reduced. In short, the configuration of the channel decreases variations in a source-drain electric current ("IDS"="I2") stemming from variations in a source-drain voltage (VDS) of the fourth MOS transistor 52. Accordingly, even if the supply voltage Vcc applied to the supply voltage node 10 somewhat changes from a specified value within a range of compensation values, for example, the electric current "I2" that flows through the third and fourth MOS transistors 51, 52 when the third MOS transistor 51 is in conduction substantially matches the specified value. In the first embodiment, the threshold voltage of the fourth MOS transistor 52 is set to 0.7 V.

Since the first given electric potential, which is applied to the gate electrode of the second MOS transistor 42, is applied to the gate electrode of the fourth MOS transistor 52, the electric current flowing through the fourth MOS transistor 52 and that flowing through the second MOS transistor 42 are set to the same value. Accordingly, the second and fourth MOS transistors 42, 52 function so as to cause the electric currents flowing through the first and third MOS transistors 41, 51 to become identical with each other.

The second resistive element 53 is connected at one end to the drain electrode of the fourth MOS transistor 52. The second capacitive element 55 is connected between the supply voltage node 10 and the drain electrode of the third MOS transistor 51. The current mirror circuit 54 comprises an input circuitry and an output circuitry. The input circuitry is connected to the drain electrode of the fourth MOS transistor so that an input current flows through therein. The output circuitry is connected to the output node 3. An output current corresponding to the input current flowing through the input circuitry flows through the output current.

The input circuitry of the current mirror circuit 54 comprises a fifth N-type MOS transistor 541, a third resistive element 542, and a sixth N-type MOS transistor 543. The fifth MOS transistor 541 is connected at its drain electrode to the other end of the second resistive element 53, being connected to the drain electrode of the fourth MOS transistor 52 via the second resistive element 53. The fifth MOS transistor 541 receives a second given electric potential applied to its gate electrode. In the first embodiment, the second given electric potential is set to 1.1 V. When the third MOS transistor 51 is in conduction, the electric current flowing through the fifth MOS transistor 541 becomes equal to the electric current "I2" flowing through the fourth MOS transistor 53.

The third resistive element 542 is connected at one end to the source electrode of the fifth MOS transistor 541. The sixth MOS transistor 543 is connected at its drain electrode to the other end of the third resistive element 542, being connected to the source electrode of the fifth MOS transistor 541 via the third resistive element 542. The source electrode of the sixth MOS transistor 543 is connected to a ground potential node 20 to which a ground electric potential (GND) is applied. In the first embodiment, the ground electric potential (GND) is set to 0 V. The sixth MOS transistor 543 is connected at its gate electrode to the drain electrode of the fifth MOS transistor 541. An electric current "I4" flowing through the sixth MOS transistor 543 becomes identical with an electric current "I3" flowing through the fifth MOS transistor 541.

The output circuitry of the current mirror circuit 54 comprises a seventh N-type MOS transistor 544, a fourth resistive element 545, and an eighth N-type MOS transistor 546. The seventh MOS transistor 544 is connected at its drain electrode to the output node 3, and receives the second given electric potential at its gate electrode.

The fourth resistive element 545 is connected at one end to the source electrode of the seventh MOS transistor 544. The eighth MOS transistor 546 is connected at its drain electrode to the other end of the fourth resistive element 545, being connected to the source electrode of the seventh MOS transistor 544 via the fourth resistive element 545. The eighth MOS transistor 546 is connected at its source electrode to the ground potential node 20 and at its gate electrode to the gate electrode of the sixth MOS transistor 543. The eight MOS transistor 546 and the sixth MOS transistor 543 constitute a current mirror. An electric current "I5" flowing through the eighth MOS transistor 546 becomes identical with the electrical current "I4" flowing through the fifth MOS transistor 541. Further, the electric current "I5" flowing through the eighth MOS transistor 546 becomes equal to the electric current "I4" flowing through the seventh MOS transistor 544.

In the first embodiment, all the fifth through eighth MOS transistors 541, 543, 544, and 546 are formed into the same size, and the channel length of these transistors is set to the minimum length. Further, in the first embodiment, the threshold voltage of the fifth through eighth MOS transistors 541, 543, 544, and 546 is set to 0.7 V.

When the third MOS transistor 51 is in conduction, the electric current flowing through the third MOS transistor 51 is specified by the electric current "I2" flowing through the fourth MOS transistor 52, thus equaling the electric current "I2" flowing through the fourth MOS transistor 52, the electric current "I3" flowing through the fifth MOS transistor 541, the electric current "I4" flowing through the sixth MOS transistor 543, the electric current "I5" flowing through the eighth MOS transistor 546, and the electric current "I6" flowing through the seventh MOS transistor 544. When the first MOS transistor 41 is in conduction, the value of the electric current flowing through the first MOS transistor 41 is specified by the electric current "I" flowing through the second MOS transistor 42, thus equaling the electric current "I1" flowing through the second MOS transistor 42. Accordingly, when the first and third MOS transistors 41, 51 are in conduction, the electric currents flowing through the first and third MOS transistors 41, 51 become equal to each other.

The second capacitive element 55 is intended to prevent noise, by absorbing the noise superimposed on a power line or the like connected to the supply voltage node 10. In the first embodiment, the second capacitive element 55 is formed from a MOS capacitor having a P-type MOS transistor configuration and has a capacitance of 2 pF.

Reference numeral 6 designates a first voltage generation circuit which is connected between the supply voltage node 10 and the ground potential node 20 and outputs the first given electric potential to the gate electrodes of the second and third MOS transistors 42, 52. A first potential output node 64 of the first voltage generation circuit 6 is connected to the gate electrodes of the second and third MOS transistors 42, 52. A first potential output node 64 of the first voltage generation circuit 5 is connected to the gate electrodes of the second and third MOS transistors 42, 52. The first voltage generation circuit 6 comprises a ninth P-type MOS transistor 61, a fifth resistive element 62, and a third capacitive element 63. The ninth MOS transistor 61 is connected between the supply voltage node 10 and a first potential output node 64 and at its gate electrode to the first potential output node 64. In the first embodiment, the channel length of the ninth MOS transistor 61 is set to the minimum length, and the threshold voltage of the transistor is set to 0.7 V.

The fifth resistive element 62 is connected between the first potential output node 64 and the ground potential node 20. The ninth MOS transistor 61 and the fifth resistive element 62 are connected in series between the supply voltage node 10 and the ground potential node 20. In the first embodiment, 2.2 V is output as the first given potential to the first potential output node 64 where the ninth MOS transistor 61 and the fifth resistive element 62 are connected together. The third capacitive element 63 is connected between the supply voltage node 10 and the first potential output node 64. The third capacitive element 63 is intended to prevent noise by absorption of the noise superimposed on a power line or the like connected to the supply voltage node 10. In the first embodiment, the third capacitive element 63 is formed from a MOS capacitor comprising a P-type MOS transistor configuration and has a capacitance of 50 pF.

Reference numeral 7 designates a second voltage generation circuit which is connected between the supply voltage node 10 and the ground potential node 20 and outputs the second given electric potential to the gate electrodes of the fifth and seventh MOS transistors 541, 544. A second potential output node 74 of the second voltage generation circuit 7 is connected to the gate electrodes of the fifth and seventh MOS transistors 541, 544. The second voltage generation circuit 7 comprises a tenth N-type MOS transistor 71, a sixth resistive element 72, and a fourth capacitive element 73. The tenth MOS transistor 71 is connected between the second potential output node 74 and the ground potential node 20 and is connected at its gate electrode to the second potential output node 74. In the first embodiment, the channel length of the tenth MOS transistor 71 is set to the minimum length, and the threshold voltage of the transistor is set to 0.7 V.

The sixth resistive element 72 is connected between the second potential output node 74 and the supply voltage node 10. The tenth MOS transistor 71 and the sixth resistive element 72 are connected in series between the supply voltage node 10 and the ground potential node 20. In the first embodiment, 1.1 V is output as the second given potential to the second potential output node 74 where the tenth MOS transistor 71 and the sixth resistive element 72 are connected together. The fourth capacitive element 73 is intended to prevent noise, by absorption of the noise superimposed on a power line or the like connected to the supply voltage node 10. In the first embodiment, the forth capacitive element 73 is formed from a MOS capacitor comprising a N-type MOS transistor configuration and has a capacitance of 50 pF.

Hereinafter, the operation of the charge pump circuit having the foregoing configuration will now be described.

Figure 2:
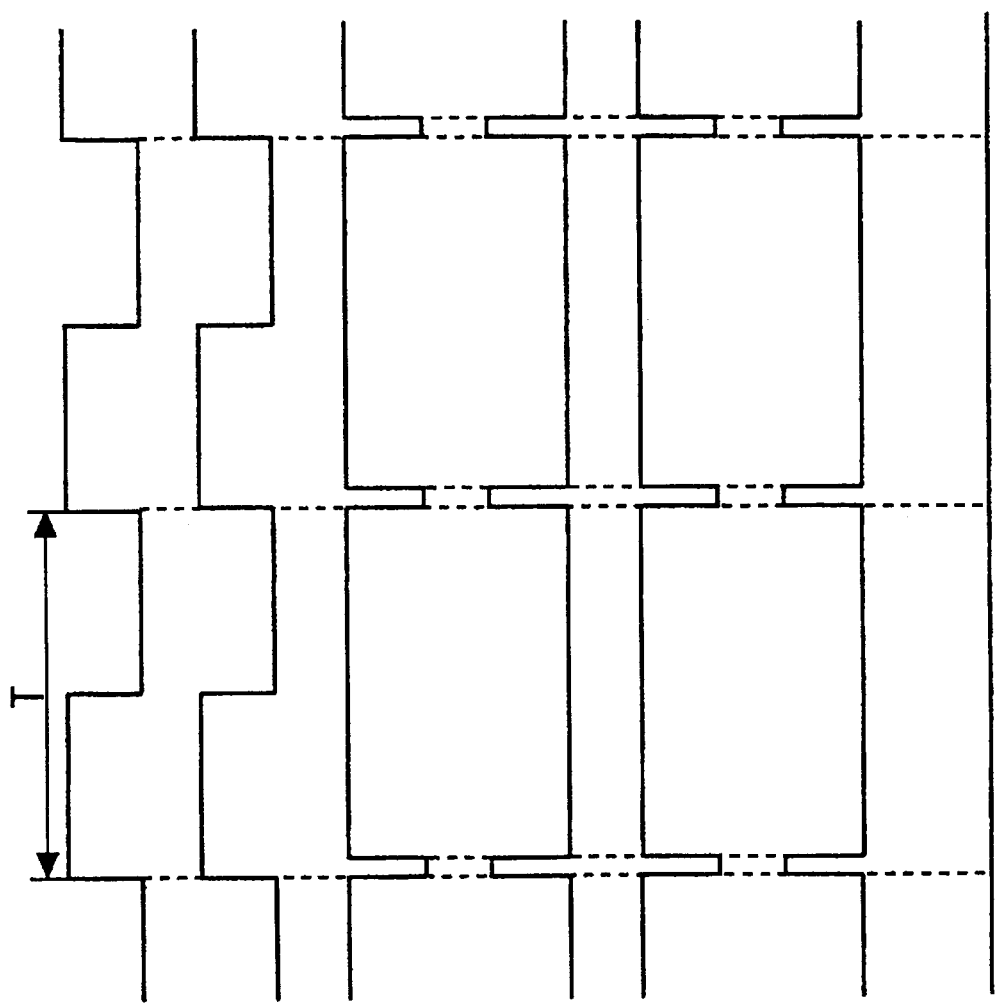
FIGS. 2A to 2G are timing charts for explaining a current output from the charge pump circuit shown in FIG. 1 when a phase difference between a reference clock signal and a clock signal to be compared is zero.

First, the operation of the charge pump circuit will be described for a case, as shown in FIG. 2, there is no phase delay between the reference clock signal and a clock signal to be compared, or where the clock signal to be compared is in synchronism with the reference clock signal. In this case, as shown in FIG. 2C, the first input signal input to the first input node 1 becomes low for a given period of time in response to the up edge of the reference clock signal. Further, as shown in FIG. 2E, the second input signal input to the second input node 2 also becomes low for a given period of time in response to the up edge of the reference clock signal. In the first embodiment, one cycle "T" of the reference clock signal is 14 ns, and the given period of time during which the first and second input signals are held in a low state is set to 2 ns.

When the first input signal becomes low, the first MOS transistor 41 is brought into conduction. As a result, the electric current—which is specified by the second MOS transistor 42 and has the value "I1"—flows to the output node 3 from the supply voltage node 10 by way of the first and second MOS transistors 41, 42 and the first resistive element 43. In short, the charge current "I1" provided in FIG. 2D flows toward the output node 3.

In contrast, when the second input signal becomes low, the third MOS transistor 51 is brought into conduction. As a result, the electric current "I"2—which is specified by the fourth MOS transistor 42—flows to the current mirror circuit 54 from the supply voltage node 10 by way of the third and fourth MOS transistors 51, 52 and the second resistive element 53.

In the current mirror circuit 54, the electric current "I3"—which is controlled so as to equal the value of "I2"—flows to the fifth MOS transistor 541. Further, the electric current "I4" equal to the value of "I3" flows to the sixth MOS transistor 543. The electric current "I2" (="I3"="I4") flows to the ground potential node 20 from the supply voltage node 10 by way of the third and fourth MOS transistors 51, 52, the second resistive element 53, the fifth MOS transistor 541, the third resistive element 542, and the sixth MOS transistor 543. Since the eighth MOS transistor 546 and the sixth MOS transistor 543 constitute a current mirror configuration, the electric current "I5" equal to the value of "I4" flows through the eighth MOS transistor 546. Further, the electric current "I6" equal to the value of "I5" flows to the seventh MOS transistor 544. The electric current "I6" (="I5"="I4"="I2") flows to the ground potential node 10 from the output node 3 by way of the seventh MOS transistor 544, the fourth resistive element 545, and the eighth MOS transistor 546. In short, as shown in FIG. 2F, the discharge current "I2" is withdrawn from the output node 3.

The first and third MOS transistors 41, 51 are formed from identical transistors, and at this time the first given electric potential is applied to the gate electrodes of the second and fourth MOS transistors 42, 52. Accordingly, the electric currents "I1", "I2" flowing to the second and fourth MOS transistors 42, 52 become equal to each other. Eventually, the charge current "I1" produced by the charge current generation circuit 4 equals the discharge current "I6" (="I2") produced by the discharge current generation circuit 5. Therefore, the charge current flowing out from the output node 3 and the discharge current flowing into the output node 3 becomes zero, thus resulting in a zero output current such as that shown in FIG. 2G.

In the first embodiment, each section of the charge pump circuit has the following electric potentials. The supply voltage applied to the supply voltage node 10 is 3.3 V, and the electric potential of the source electrode of the second MOS transistor 42 is 2.9 V. The electric potential of the gate electrode of the second MOS transistor 42, or the first given potential, is 2.2 V. The electric potential of the output node 3 is 1.7 V, and electric potential of the source electrode of the fourth MOS transistor 52 is 2.9 V. The electric potential of the gate electrode of the fourth MOS transistor 52 is 2.2 V, and the electric potential of the drain electrode of the fifth MOS transistor 541 and the electric potential of the gate electrodes of the sixth and eighth MOS transistors 543, 546 is 0.7 V. The electric potential of the source electrode of the seventh MOS transistor 543 is 0.3 V.

The gate-source voltage of the second and fourth MOS transistors 42, 52 is 0.7 (=2.9–2.2)V and equals the threshold voltage of these transistors 42, 52. Thus, the electric currents "I1", "I2" flowing into the transistors 42, 52 assume minute values. Accordingly, the power dissipated during the period—in which the clock to be compared is in synchronism with the reference clock—assumes a very small value.

In contrast, when the first input signal is high, the first MOS transistor 41 is brought out of conduction, thus preventing flow of the electric current to the output node 3 from the supply voltage node 10. In short, as shown in FIG. 2D, the charge current "I1" produced by the charge current generation circuit 4 becomes zero.

Further, when the second input signal is high, the third MOS transistor 51 is brought out of conduction, preventing flow of the electric current to the fourth through fifth MOS transistors 51, 541, and 543. As a result, no electric current flows to the seventh and eighth MOS transistors 544, 546. More specifically, as shown in FIG. 2F, the discharge current "I5" from the discharge current generation circuit 5 becomes zero.

As mentioned previously, when both the first and second input signals are high, both the charge current "I1" produced by the charge current generation circuit 4 and the discharge current "I6" produced by the discharge current generation circuit 5 assume a value of zero, and hence the output current "I" assumes a value of zero, as shown in FIG. 2G.

Next, an explanation will describe the operation of the charge pump circuit when the clock signal to be compared lags in phase behind the reference clock signal. As shown in FIG. 3C, the first input signal input to the first input node 1 becomes low for a given period of time in response to the up edge of the reference clock signal and then becomes high in response to the up edge of the clock signal to be compared. As shown in FIG. 3E, the second input signal input to the second input node 2 becomes low for a given period of time in response to the up edge of the reference clock signal, as well as in the case where there is no phase delay between the clock signals.

If both the first and second input signals are low, the charge current "I" (see FIG. 3D) flows to the output node 3 from the charge current generation circuit 4, and the discharge current "I6" (see FIG. 3F) is withdrawn into the discharge current generation circuit 5 from the output node 3, as well as in the foregoing case where there is no phase delay between the reference clock signal and the clock signal to be compared. Accordingly, as shown in FIG. 3G, the output current "I" becomes zero.

When the first input signal is low and the second input signal is high, the charge current "I1" (see FIG. 3D) flows to the output node 3 from the charge current generation circuit 4, and the discharge current "I6" (see FIG. 3F) produced by the discharge current generation circuit 5 is zero. Accordingly, as shown in FIG. 3G, the output current "I" flows out from the output node 3 as the charge current "I1".

When both the first and second input signals are high, the charge current "I" (see FIG. 3D) produced by the charge current generation circuit 4 is zero, and the discharge current "I6" (see FIG. 3F) produced by the discharge current generation circuit 5 is zero, as well as in the case where there is no phase delay between the reference clock signal and the clock signal to be compared. Accordingly, as shown in FIG. 3G, the output current "I" becomes zero.

As mentioned previously, in a case where the clock signal to be compared lags in phase behind the reference clock signal, the charge current flows out from the output node 3 during a period corresponding to the period of phase difference between the reference clock signal and the clock signal to be compared.

Next, an explanation will describe the operation of the charge pump circuit when the clock signal to be compared leads in phase the reference clock signal. At this time, as shown in FIG. 4C, the first input signal input to the first input node becomes low for a given period of time in response to the up edge of the reference clock signal, as well as in the case where there is no phase delay between the reference clock signal and the clock signal to be compared. Further, as shown in FIG. 4E, the second input signal input to the second input node becomes low in response to the up edge of the clock signal to be compared and becomes high after lapse of a given period of time following the up edge of the reference clock signal.

When both the first and second input signals are low, the charge current "I1" (see FIG. 4D) flows to the output node 3 from the charge current generation circuit 4, and the discharge current "I6" (see FIG. 4F) is withdrawn from the output node 3 by means of the discharge current generation circuit 5, as well as in the case where there is no phase delay between the reference clock signal and the clock signal to be compared. Accordingly, as shown in FIG. 4G, the output current "I" becomes zero.

Further, when the second input signal is low and the first input signal is high, the discharge current "I6" (see FIG. 4F) is withdrawn from the output node 3 by the discharge current generation circuit 5, and the charge current "I1" (see FIG. 4D) produced by the charge current generation circuit 4 becomes zero. Accordingly, as shown in FIG. 4G, the output current "I" is withdrawn from the output node 3 as the discharge current "I6".

When both the first and second input signals are high, the charge current "I1" (see FIG. 4D) produced by the charge current generation circuit 4 is zero, and the discharge current "I6" (see FIG. 4F) produced by the discharge current generation circuit 5 is zero. Accordingly, as shown in FIG. 4G, the output current "I" becomes zero.

As mentioned previously, in a case where the clock signal to be compared leads in phase the reference clock signal, the discharge current is withdrawn from the output node 3 for a period of time corresponding to the period of phase difference between the reference clock signal and the clock signal to be compared.

Figure 5:
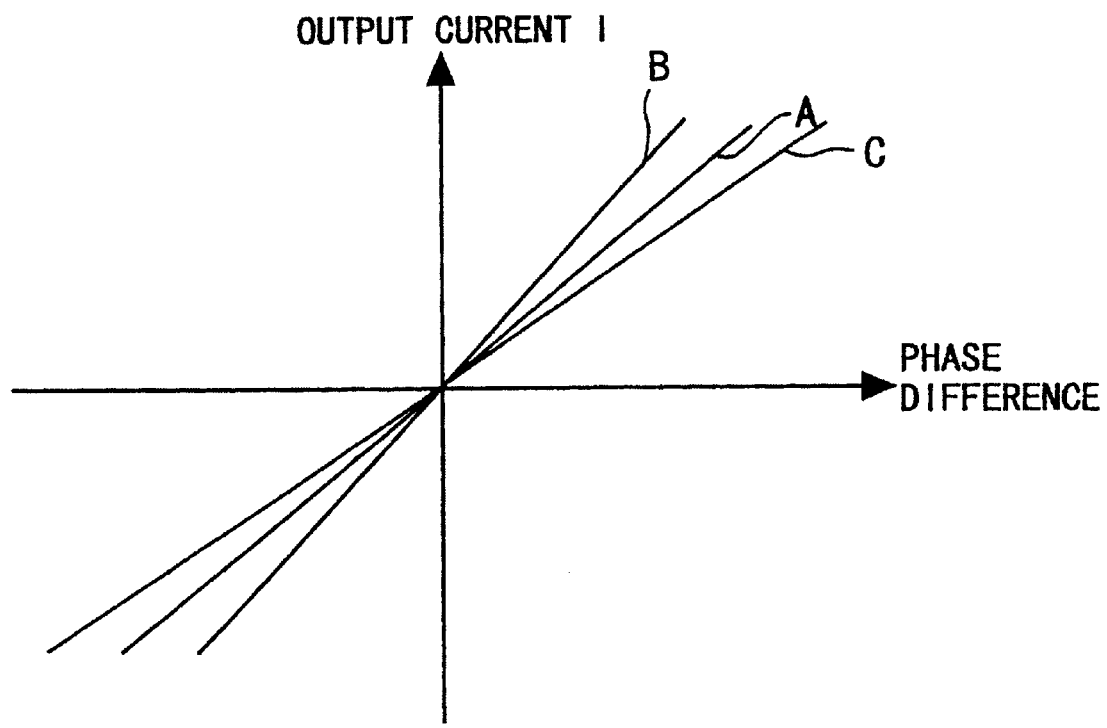
FIG. 5 is a plot showing a relationship between the phase difference between the reference clock signal and the clock signal to be compared, which stems from variations in a manufacturing process, and the electric current output from the charge pump circuit shown in FIG. 1.

The MOS transistors are designed in such a way that the charge pump circuit having the foregoing configuration exhibits a characteristic such as that depicted by line A provided in FIG. 5. Various such transistors were manufactured, and there was measured the relationship between an output current from the charge pump circuit and the phase difference between the reference clock signal and a clock signal to be compared. Hereinafter, an explanation will describe the measured results of the relationships.

For example, when the channel length of each MOS transistor becomes shorter than a design value, an electric current flowing through the MOS transistor when the transistor is in conduction becomes greater than the electric current which would otherwise flow through the MOS transistor if the channel length of the MOS transistor were the same as the design value. In this case, the P-type MOS transistor makes the current grater with a higher ratio than the N-type MOS transistor does.

In spite of such a circumstance, there is obtained the relationship between the output current and the phase difference between the reference clock signal and the clock signal to be compared, such as that depicted by line B provided in FIG. 5. When there is no phase difference, the output current is substantially zero. Thus, there is no substantial offset in the phase difference when the output current is zero.

If the channel length of each MOS transistor becomes longer than a design value, the electric current that flows through the MOS transistor when the transistor is in conduction becomes smaller than the electric current which would otherwise flow through the MOS transistor if the channel length of the MOS transistor is the same as the design value. In this case, the P-type MOS transistor makes the current smaller with a higher ratio than the N-type MOS transistor does.

In spite of such a circumstance, there is obtained the relationship of the output current to the phase difference between the reference clock signal and the clock signal to be compared, such as that depicted by line C provided in FIG. 5. When there is no phase difference, the output current is substantially zero. Thus, there is no substantial offset in the phase difference when the output current is zero.

The reason why no substantial offset arises even when the transistors vary somewhat from their design values during the process of manufacture of the transistors is considered to be attributable to the following reasons.

Specifically, the first and second input signals are input to the P-type MOS transistors 41, 51 which are of the same conductivity type and having equivalent design values. Further, the electric current flowing through the first MOS transistor 41 is specified by the second MOS transistor 42, and the electric current flowing through the third MOS transistor 51 is specified by the fourth MOS transistor 52. Still further, the second and fourth MOS transistors 42, 52 are of the same conductivity type, i.e., P-type MOS transistors. The electric current flowing through the third MOS transistor 51 is taken as the discharge current through use of the current mirror circuit 54 comprising the N-type MOS transistors 541, 543, 544, and 546. Moreover, the channel length of the second MOS transistor 42 is made longer than that of the first MOS transistor 41, and the channel length of the fourth MOS transistor 52 is made longer than that of the third MOS transistor 51.

Further, the characteristics of the output current may change in the manner such as that depicted by line B or C provided in FIG. 5, even in a case where the charge pump circuit is used in a situation where the supply voltage is higher or lower than a specified value, or in a case where it is used at a varying operating temperature. However, according to the charge pump circuit of the first embodiment, the output current is nearly zero when the phase difference is zero and has substantially no offset when the output current is zero.

Next, the inventors examined the relationship among the second MOS transistor 42, the fourth MOS transistor 52, and an offset. As a result of the channel width of the second MOS transistor 42 being made larger than that of the fourth MOS transistor 52, in the majority of cases the output current became zero when the phase difference was zero, without regard to variations in a manufacturing process, variations in supply voltage, or differences in operating temperature.

Accordingly, it is effective to make the channel width of the second MOS transistor larger than that of the fourth MOS transistor.

The charge pump circuit having the configuration such as that mentioned above has the following effects.

First, the charge pump circuit is configured in such a way that the first and second input signals are input to the P-type MOS transistors 41, 51 which are of the same conductivity type and having equivalent design values; the electric current flowing through the first MOS transistor 41 is specified by the second MOS transistor 42; the electric current flowing through the third MOS transistor 51 is specified by the fourth MOS transistor 52; the second and fourth MOS transistors 42, 52 are of the same conductivity type, i.e., P-type MOS transistors; and the electric current flowing through the third MOS transistor 51 is taken as the discharge current through use of the current mirror circuit 54 comprising the N-type MOS transistors 541, 543, 544, and 546. By virtue of the foregoing configuration, the charge pump circuit has the effect of producing a substantially zero output current at the time of a zero phase difference, even if there are variations in manufacturing processes, variations in supply voltage, or differences in operating temperatures.

Second, since the channel length of the second MOS transistor 42 is made longer than that of the first MOS transistor 41, and since the channel length of the fourth MOS transistor 52 is made longer than that of the third MOS transistor 51, the Early effect of the second MOS transistor 42 and that of the fourth MOS transistor 52 can be reduced. The configuration discussed above is effective to prevent occurrence of an offset in phase difference in a situation where variations are expected to occur in the supply voltage even within a range of compensation.

Third, a phase difference is more effectively prevented from being offset, so long as the channel width of the second MOS transistor is made greater than that of the fourth MOS transistor.

Fourth, since the first voltage generation circuit 6 is made up of the ninth MOS transistor 61, the fifth resistive element 62, and the third capacitive element 63, a desired electric potential can be imparted to the gate electrodes of the second and fourth MOS transistors 42, 52 with requirement of only small occupation areas.

Fifth, since the second voltage generation circuit 7 is made up of the tenth MOS transistor 71, the sixth resistive element 72, and the fourth capacitive element 73, a desired electric potential can be imparted to the gate electrodes of the fifth and seventh MOS transistors 541, 544 with requirement of only small occupation areas.

In the foregoing first embodiment, in order to improve the stability (or a margin of phase) of the entire system when the charge pump circuit is incorporated into a PLL circuit, N-type MOS transistors whose channel length is minimized are used as the MOS transistors 541, 543, 544, and 546 constituting the current mirror circuit 54. With a view to reducing the Early effect, the channel length of these transistors may be made slightly longer than the minimum length.

Second Embodiment

Figure 6:
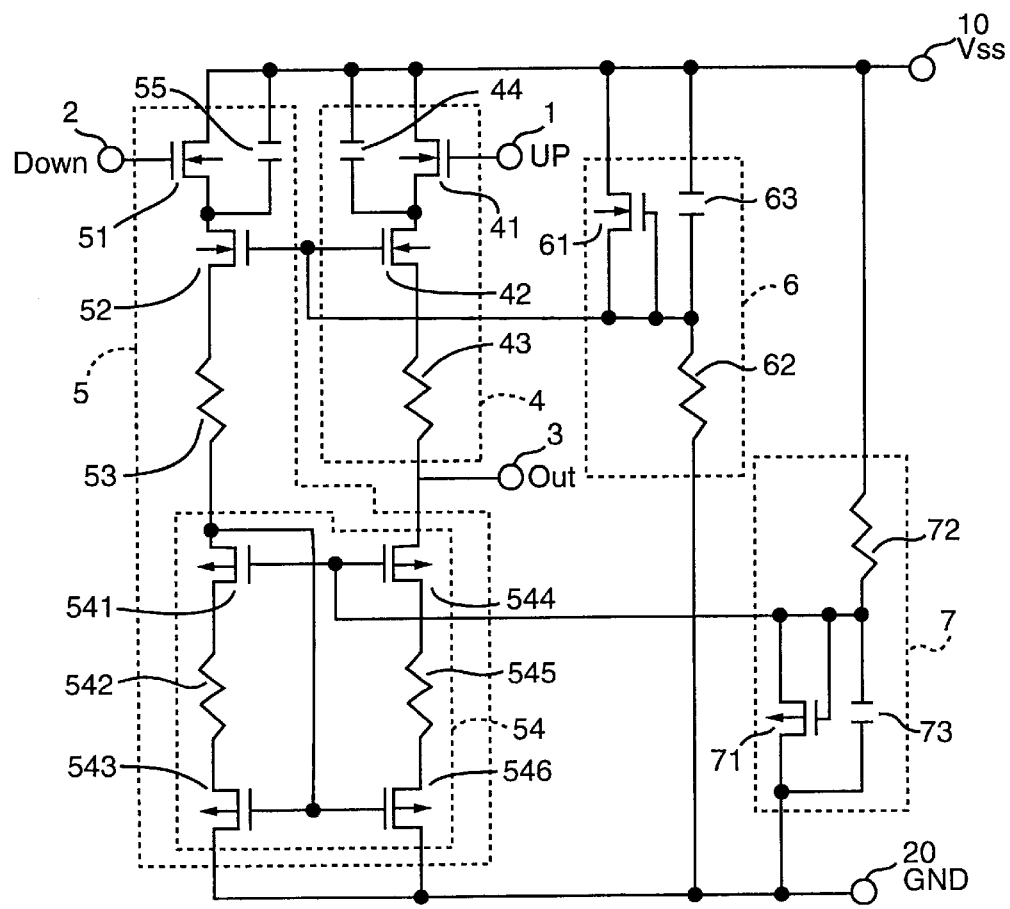
FIG. 6 is a schematic diagram showing a charge pump circuit which serves as a charge/discharge current generation circuit according to a second embodiment of the present invention.

FIG. 6 shows a second embodiment of the present invention. The present embodiment differs from the first embodiment only in that the first through fourth and ninth MOS transistors 41, 42, 51, 52, and 61 are formed into N-type MOS transistors and that the fifth through eighth and tenth MOS transistors 541, 543, 544, 546, and 71 are formed into P-type MOS transistors. In other respects, the two embodiments are completely identical with each other.

In FIG. 6, the elements which are the same as or correspond to those provided in FIG. 1 are assigned the same reference numerals.

Figure 7:
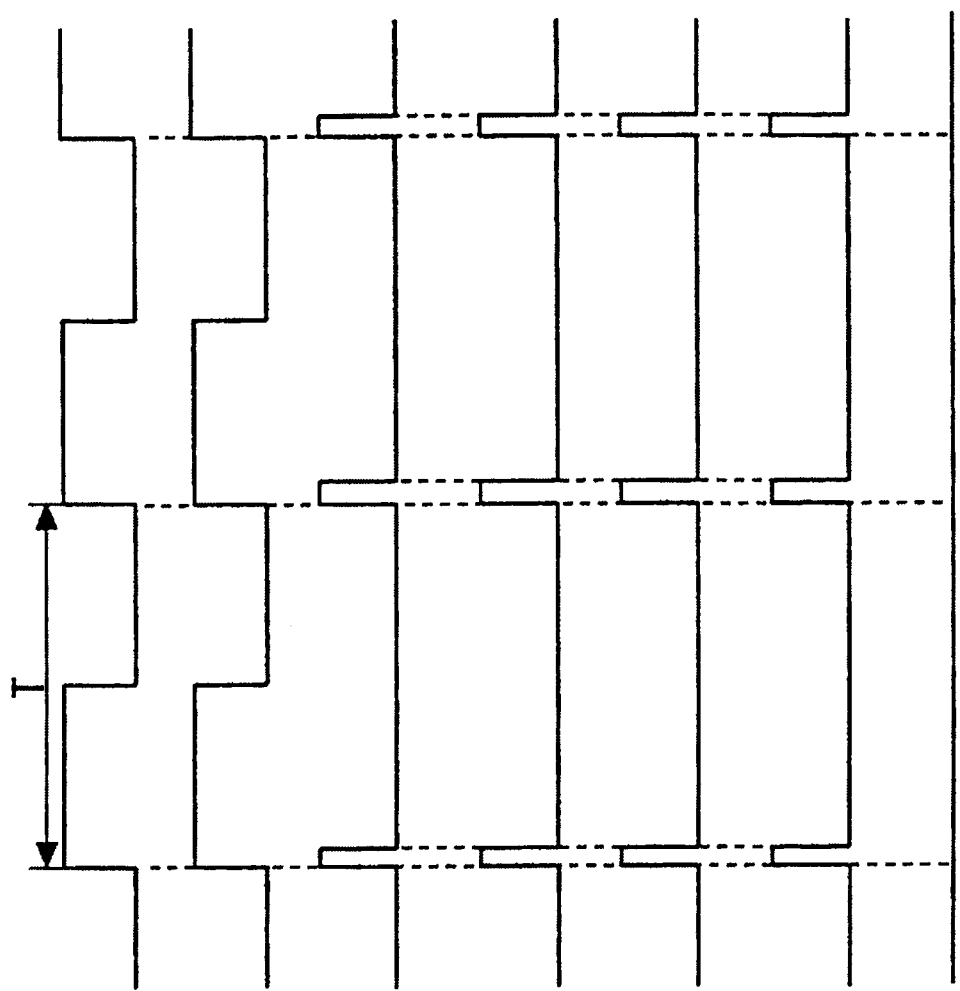
FIGS. 7A to 7G are timing charts for explaining a current output from the charge pump circuit shown in FIG. 6 when a phase difference between a reference clock signal and a clock signal to be compared is zero.
Figure 8:
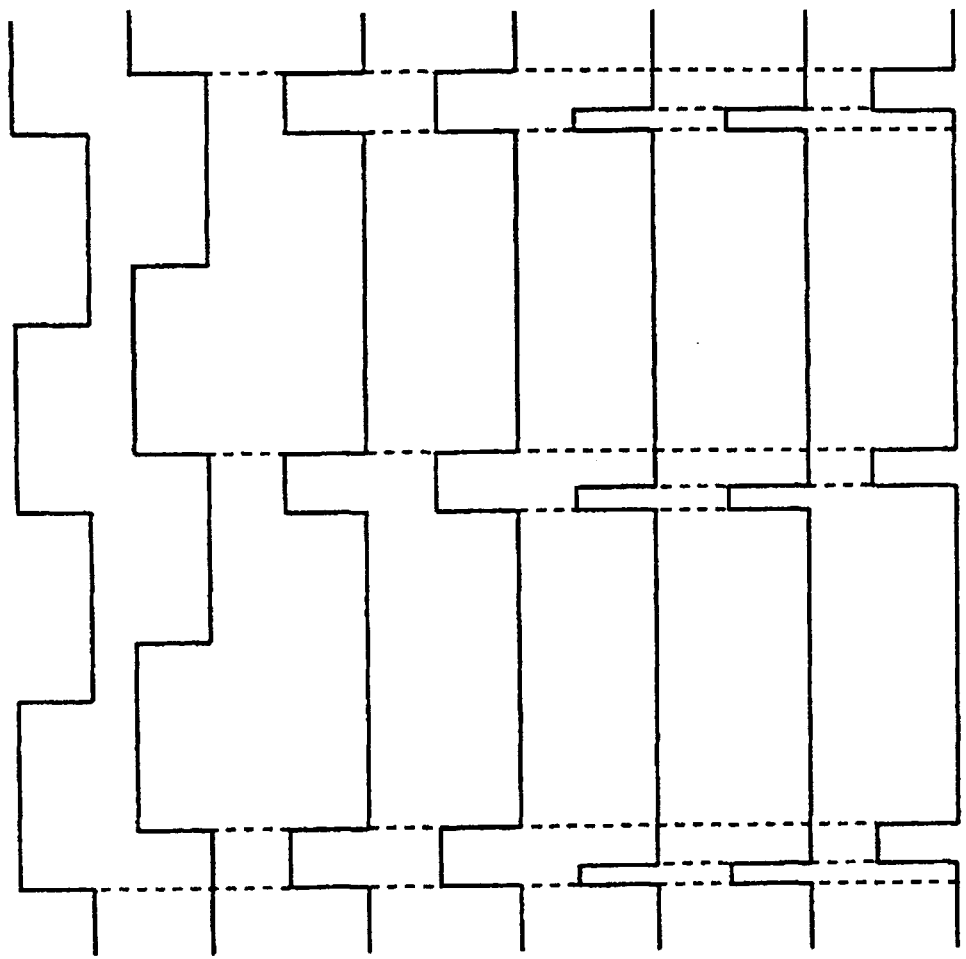
FIGS. 8A to 8G are timing charts for explaining a current output from the charge pump circuit shown in FIG. 6 when the clock signal to be compared lags behind the reference clock signal.
Figure 9:
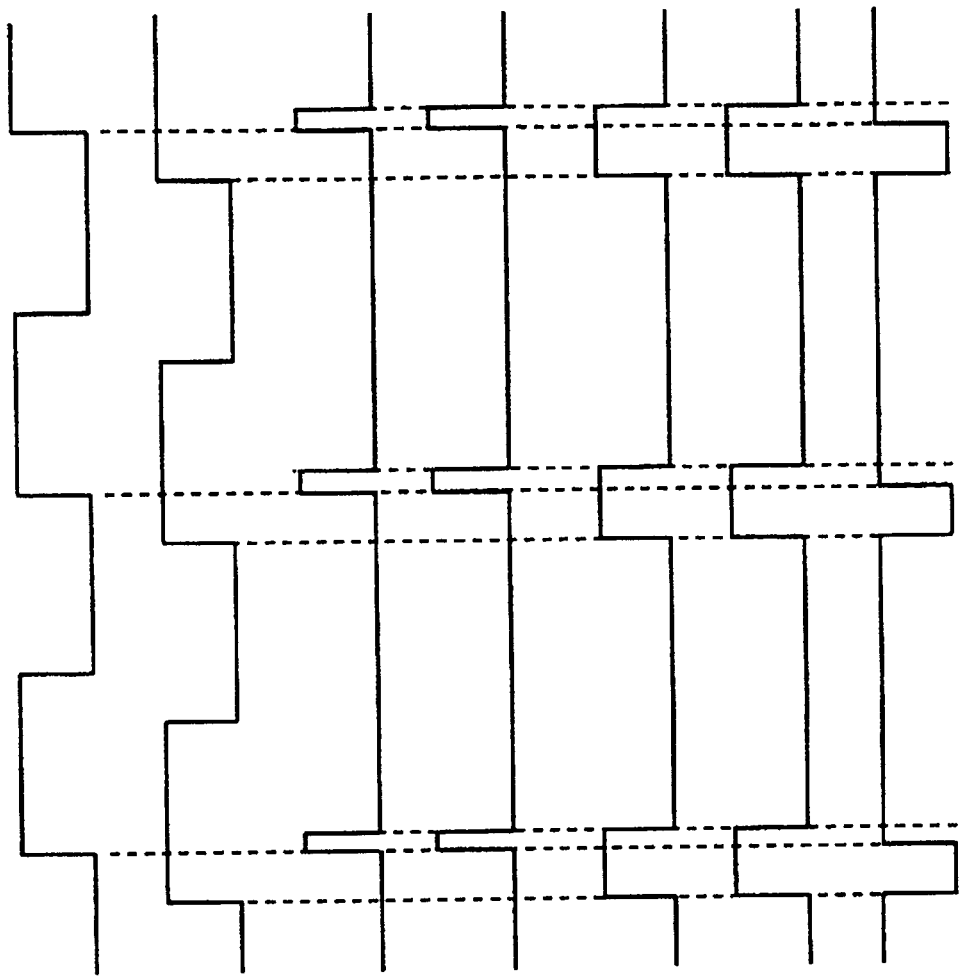
FIGS. 9A to 9G are timing charts for explaining a current output from the charge pump circuit shown in FIG. 6 when the clock signal to be compared leads the reference clock signal.

As shown in FIGS. 7 through 9, even the charge pump circuit having the foregoing configuration operates in the same way as that in the first embodiment, in each of the cases where the clock signal to be compared is in synchronism with the reference clock signal (see FIG. 7), where the clock signal to be compared lags in phase behind the reference clock signal (see FIG. 8), and where the clock signal to be compared leads the reference clock signal (see FIG. 9), so long as the relationship of the "H" level and the "L" level of the first input signal and the second input signal is reversed.

Figure 10:
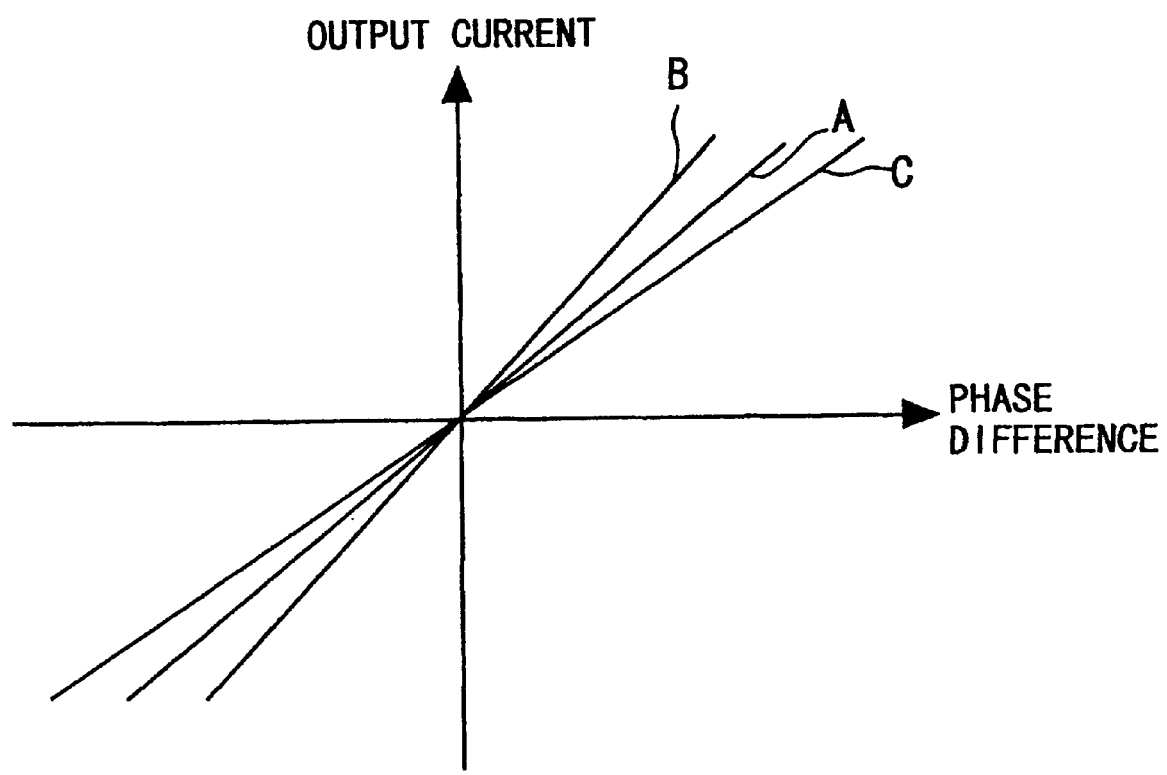
FIG. 10 is a plot showing a relationship between the phase difference between the reference clock signal and the clock signal to be compared, which stems from variations in a manufacturing process, and the electric current output from the charge pump circuit shown in FIG. 6.

Further, there is obtained a relationship between the output current and the phase difference between the reference clock signal and the clock signal to be compared, such as that shown in FIG. 10. The output current becomes substantially zero when the phase difference is zero, without regard to variations in a manufacturing process, variations in supply voltage, or differences in operating temperature.

In short, even in the charge pump circuit having the foregoing configuration, there is yielded the same advantageous result as that yielded by the first embodiment.

Third Embodiment

Figure 3:
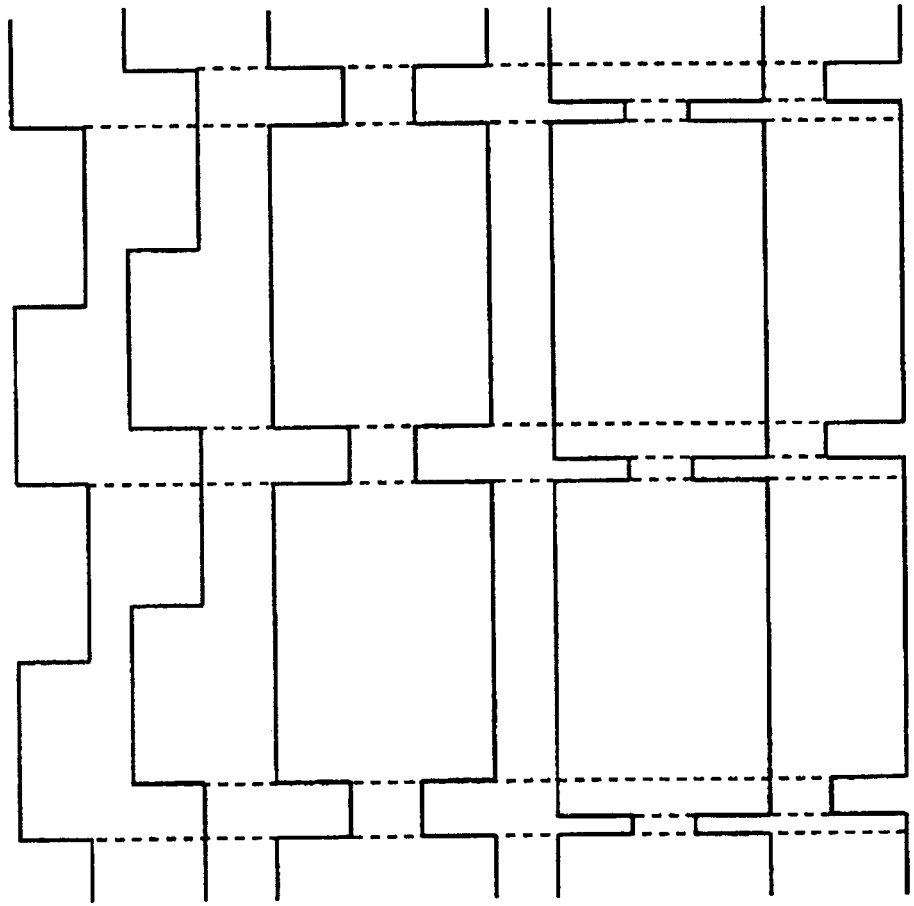
FIGS. 3A to 3G are timing charts for explaining a current output from the charge pump circuit shown in FIG. 1 when the clock signal to be compared lags behind the reference clock signal.
Figure 4:
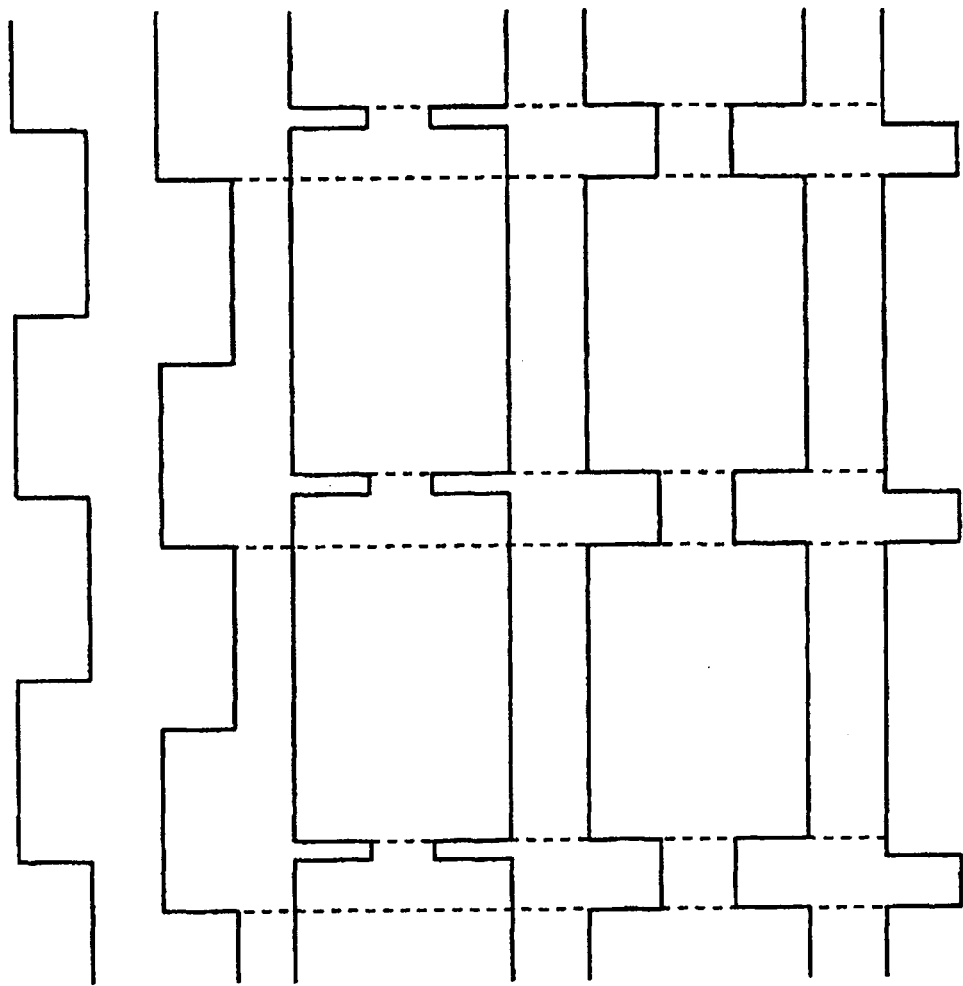
FIGS. 4A to 4G are timing charts for explaining a current output from the charge pump circuit shown in FIG. 1 when the clock signal to be compared leads the reference clock signal.
Figure 11:
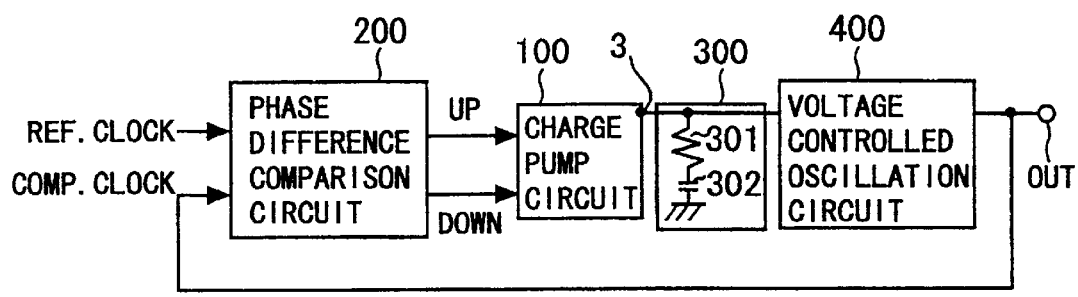
FIG. 11 is a block diagram showing a PLL circuit according to a third embodiment of the present invention.

FIG. 11 shows a PLL circuit according to a third embodiment of the present invention. In FIG. 11, reference numeral 200 designates a phase difference comparison circuit which receives clock signals, i.e., the reference clock signal and a clock signal to be compared from the outside of the PLL circuit. On the basis of the phase difference between these clock signals, the phase difference comparison circuit 200 outputs an "UP" signal (i.e., a first clock signal) or a "DOWN" signal (i.e., a second clock signal). As shown in FIGS. 2 through 4 (or FIGS. 7 through 9), the phase difference comparison circuit 200 outputs in response to the up edge of the reference clock signal, a low-level "UP" signal (or a high-level "UP" signal in the case shown in FIGS. 7 through 9) for a given period of time. After lapse of the given period of time, if the clock signal to be compared is high, the circuit 200 changes the "UP" signal to high state (or a low state in the case shown in FIGS. 7 through 9). In contrast, if the clock signal to be compared is low, the circuit 200 holds the "UP" signal in a low state (or a high state in the case shown in FIGS. 7 through 9), changing the "UP" signal to high (or low in the case shown in FIGS. 7 through 9) in response to the up edge of the clock signal to be compared. Further, as shown in FIGS. 2 through 4 (or FIGS. 7 through 9), the phase difference comparison circuit 200 outputs a low-level "DOWN" signal (or a high-level "DOWN" signal in the case shown in FIGS. 7 through 9) in response to the up edge of the clock signal to be compared when the reference clock signal is low. The circuit 200 holds the "DOWN" signal in a low state (or high in the case shown in FIGS. 7 through 9) for a given period of time after occurrence of an up edge of the reference clock signal. Then the circuit 200 changes the "DOWN" signal to a high state (or low in the case shown in FIGS. 7 through 9) after lapse of the given period of time.

In the third embodiment, a clock signal within the frequency range of 10 MHz to 200 MHz can be used as the clock signal received from the outside of the PLL circuit (i.e., the reference clock signal).

Reference numeral 100 designates a charge pump circuit which outputs a charge or discharge current upon receipt of the "UP" or "DOWN" signal from the phase difference comparison circuit 200. The charge pump circuit is configured as the circuit according to the first embodiment shown in FIG. 1 or as the circuit according to the second embodiment shown in FIG. 2. Reference numeral 300 designates a low-pass filter which outputs a control voltage according to an output (i.e., the charge or discharge current) from the charge pump circuit 100. The low-pass filter 300 comprises a resistive element 301 connected at one end to the output node 3 of the charge pump circuit 100 and a capacitive element 302 connected between the other end of the resistive element 301 and the ground potential node. When the charge current flows into the capacitive element 302 from the charge pump circuit 100, the electric potential of the capacitive element 302 rises, so that the low-pass filter 300 outputs a control voltage having an increased potential. Conversely, when the discharge current is withdrawn from the capacitive element 302 by means of the charge pump circuit 100, the electric potential of the capacitive element 302 drops, so that the low-pass filter 300 outputs a control voltage having a decreased potential.

Reference numeral 400 designates a voltage-controlled oscillation circuit. The circuit 400 outputs a clock signal to the phase difference comparison circuit 200 as a clock signal to be compared as well as to an output terminal "OUT" of the oscillation circuit. The circuit 400 controls the clock signal based on the control voltage received from the low-pass filter 300. The voltage-controlled oscillation circuit 400 is formed from a ring oscillator.

The phase-difference comparison circuit 200, the charge pump circuit 100, the low-pass filter 300, and the voltage-controlled oscillation circuit 400 are integrated into one semiconductor integrated circuit device.

The PLL circuit having the foregoing configuration operates in the following manner. Specifically, the phase difference comparison circuit 200 outputs an "UP" or "DOWN" signal shown in FIGS. 2C through 4C (or FIGS. 6C through 9C) on the basis of a phase difference between the reference clock signal shown in FIGS. 2A through 4A (or FIGS. 6A through 9A) and a clock signal to be compared shown in FIGS. 2B through 4B (or FIGS. 6B through 9B). Upon receipt of the "UP" or "DOWN" signal from the phase difference circuit 200, the charge pump circuit 100 outputs an output current (or the charge or discharge current) shown in FIGS. 2G through 4G (or FIGS. 6G through 9G) on the basis of the thus-received "UP" or "DOWN" signal.

As has been described in the first and second embodiments, the output current of the charge pump circuit 100 becomes substantially zero when the phase difference is zero, without regard to variations in a manufacturing process, variations in supply voltage, or differences in operating temperature. Accordingly, when the phase difference between the reference clock signal input to the phase difference comparison circuit 200 and the clock signal to be compared is zero, the charge pump circuit 100 outputs a current of substantially zero.

The low-pass filter 300 becomes charged or discharged on the basis of the output current from the charge pump circuit 100 and outputs a control voltage on the basis of the current output from the charge pump circuit 100. The voltage-controlled oscillation circuit 400 outputs the clock signal controlled by the control voltage received from the low-pass filter 300 to the phase difference comparison circuit 200 as a clock signal to be compared as well as to the output terminal "OUT".

In the PLL circuit having the foregoing configuration, the charge pump circuit 100 produces an output current of substantially zero when the phase difference between the reference clock signal input to the phase difference comparison circuit 200 and the clock signal to be compared is zero, without regard to variations in a manufacturing process, variations in supply voltage, or differences in operating temperature. The PLL circuit has the advantage of providing a margin of timing design.

Fourth Embodiment

Figure 12:
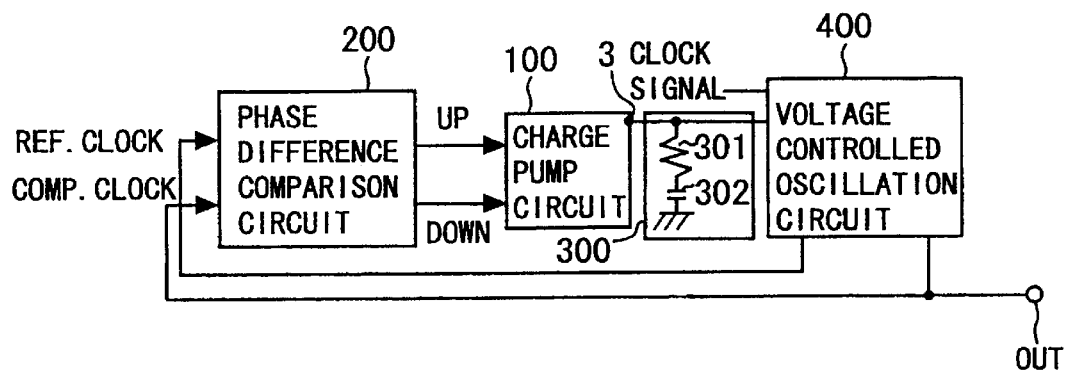
FIG. 12 is a block diagram showing a PLL circuit according to a fourth embodiment of the present invention.

FIG. 12 shows a PLL circuit according to a fourth embodiment of the present invention. In contrast with the PLL circuit mentioned in the third embodiment in which the voltage-controlled oscillation circuit 400 is formed from a ring oscillator, the PLL circuit has a voltage-controlled oscillation circuit comprising a delay controller. In other respects, these PLL circuits are completely identical with each other.

In FIG. 12, the elements which are the same as or correspond to those shown in FIG. 11 are assigned the same reference numerals.

The voltage controlled oscillation circuit 400 consisting of the delay controller controls a delay time based on the controlled voltage received from the low-pass filter 300, producing a plurality of delay clock signals on the basis of the clock signal received from the outside of the PLL circuit which are out of phase with one another by the thus-controlled delay time. Of the plurality of delayed clock signals, two delayed clock signals which are out of phase by one cycle of the clock signal received from the outside of the PLL circuit are output as a reference clock signal and a clock signal to be compared. Of the two delayed clock signals which are out of phase by one cycle of the clock signal, a delayed clock signal which lags behind the clock signal by one cycle is output from the output terminal "OUT".

In the fourth embodiment, a clock signal within the frequency range of 10 MHz to 200 MHz can be used as the clock signal received from the outside of the PLL circuit.

Even the PLL circuit having the foregoing configuration yields an advantageous result analogous to that yielded by the PLL circuit according to the third embodiment.

Fifth Embodiment

Figure 13:
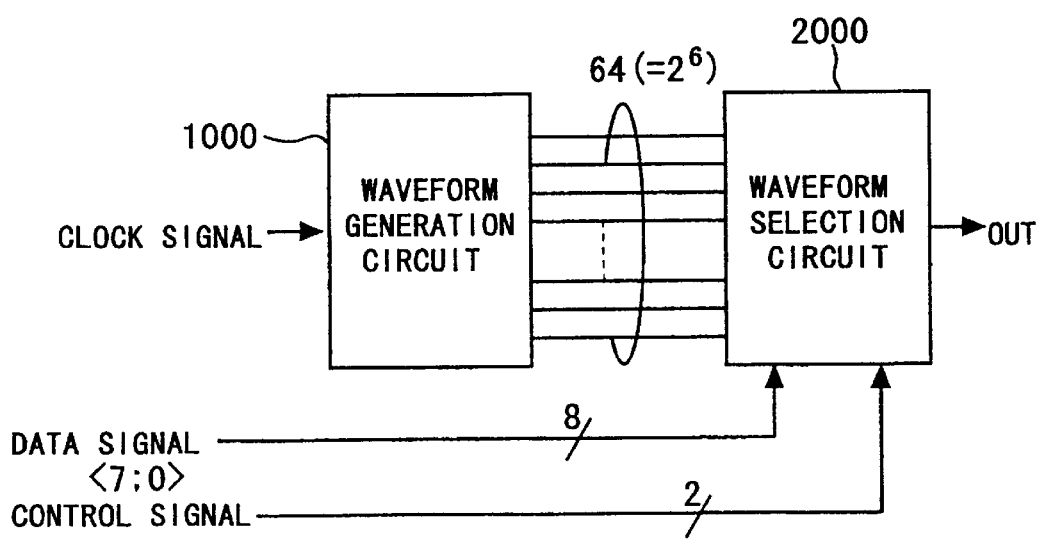
FIG. 13 is a block diagrams showing a pulse-width modulation circuit according to a fifth embodiment of the present invention.
Figure 14:
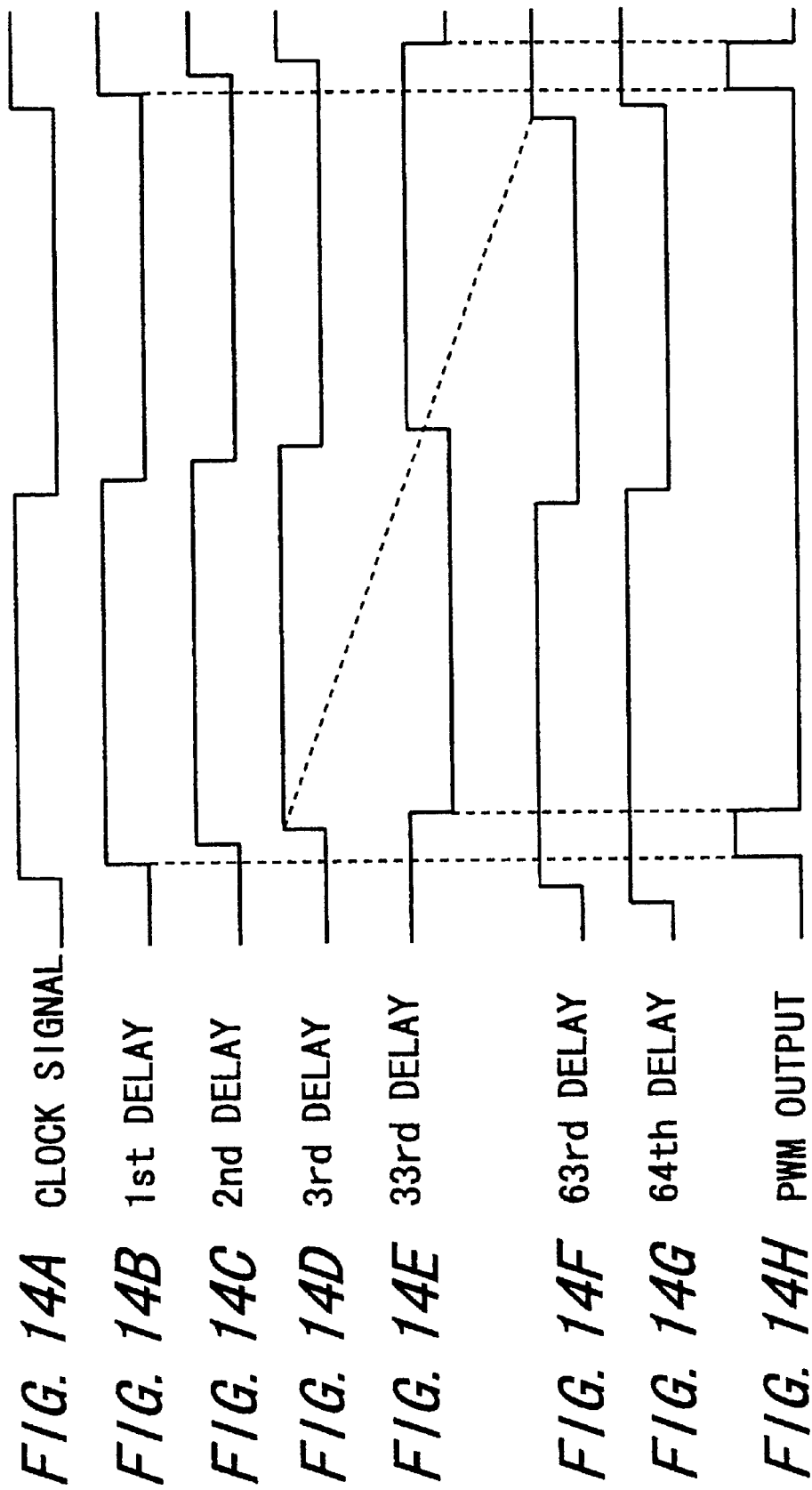
FIGS. 14A to 14H are timing charts showing the principal signals in the pulse-width modulation circuit shown in FIG. 13.

FIGS. 13 through 20 show a pulse-width modulation circuit according to the fifth embodiment of the present invention. In FIG. 13, reference numeral 1000 designates a waveform generation circuit which receives an input clock signal shown in FIG. 14A and outputs a plurality of clock signals for selection purposes (see FIGS. 14B to 14F)— which are out of phase with one another by a given difference—on the basis of the received input clock signal. In the fifth embodiment, the waveform generation circuit 1000 outputs 64 clock signals, i.e., 1st through 64th clock signals for selection purposes (or 26 delayed outputs). The sixty four clock signals for selection purposes are out of phase with one another in increments of one sixty-fourth of one cycle "T" of the input clock signal.

Reference numeral 2000 designates a waveform selection circuit which receives a plurality of clock signals for selection purposes (hereinafter simply referred to as "selection clock signals") from the waveform generation circuit 1000 and a selection signal comprising eight bits of data signal and two bits of control signal. The waveform selection circuit 2000 selects two selection clock signals from the received plurality of selection clock signals on the basis of the received selection signal. Further, the waveform selection circuit 2000 subjects the thus-selected two clock signals to AND operation, then outputting the result of such AND operation as a pulse-width modulation output signal. The pulse-width modulation circuit comprising the waveform generation circuit 1000 and the waveform selection circuit 2000 is integrated into one integrated semiconductor circuit device.

The data signal specifies the pulse width of the pulse-width modulation output signal. The control signal specifies a position of the pulse of the pulse-width modulation output signal to one of the three portions of one cycle, i.e., a leading portion, a center portion, and a trailing portion. For example, on the basis of the selection signal, the waveform selection circuit 2000 selects a one-delay output (i.e., a selection clock signal which is out of phase with the input clock signal by T/64) shown in FIG. 14B and a 33-delay output (i.e., a selection clock signal which is out of phase with the input clock signal by 33T/64) shown in FIG. 14E. In this case, the waveform selection circuit 2000 calculates the result of AND operation performed on the thus-selected one-delay output and the 33-delay output, then producing a pulse width modulation output shown in FIG. 14H.

Figure 15:
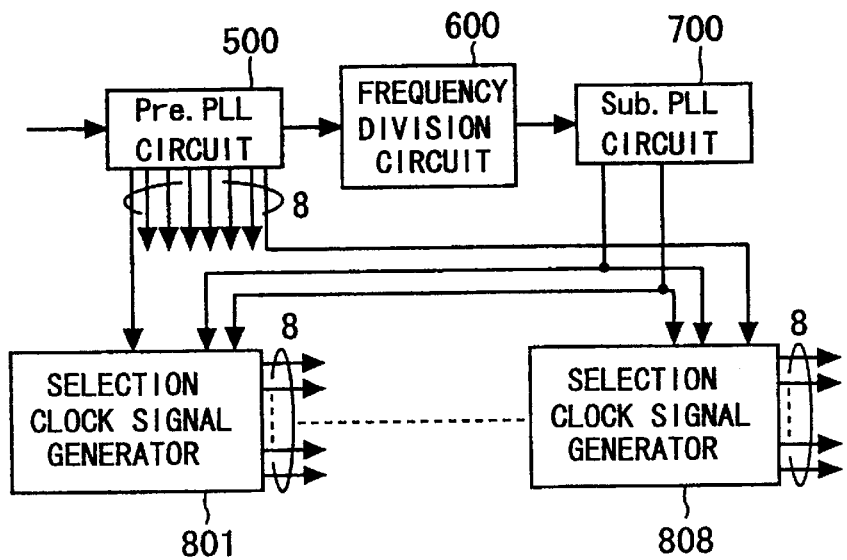
FIG. 15 is a block diagrams showing a waveform generation circuit 1000 provided in the pulse-width modulation circuit shown in FIG. 13.

As shown in FIG. 15, the waveform generation circuit 1000 comprises a preceding stage PLL circuit 500, a frequency division circuit 600, a subsequent stage PLL circuit 700, and a plurality of selection clock signals generation circuits 801 to 808.

The preceding stage PLL circuit 500 outputs a plurality of out-of-phase clock signals each of which is out of phase with the input clock signal by increments of predetermined offset. In the fifth embodiment, one cycle T of the input clock signal is 14 ns (having a frequency of 72 MHz), and the preceding stage PLL circuit 500 outputs eight out-of-phase clock signals.

Figure 16:
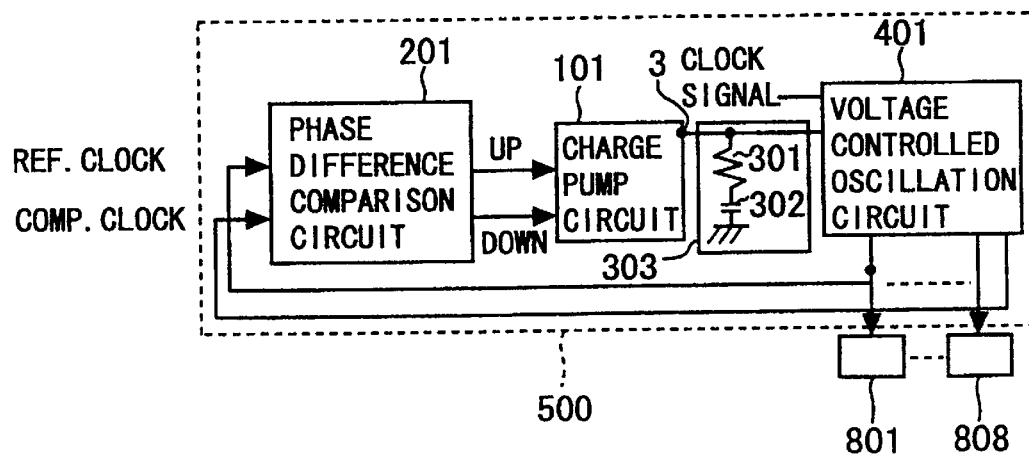
FIG. 16 is a block diagram showing a preceding stage PLL circuit 500 provided in the waveform generation circuit 1000 shown in FIG. 15.

The preceding stage PLL circuit 500 is the same in basic configuration as the PLL circuit according to the fourth embodiment shown in FIG. 12. As shown in FIG. 16, the preceding stage PLL circuit 500 comprises a phase-difference comparison circuit 201, a charge pump circuit 101, a low-pass filter 303, and a voltage-controlled oscillation circuit 401.

The phase-difference comparison circuit 201 outputs an "UP" or "DOWN" signal on the basis of the phase difference between the reference clock signal and a clock signal to be compared. Upon receipt of the "UP" or "DOWN" signal from the phase-difference comparison circuit 201, the charge pump circuit 101 outputs an output current (or a charge or discharge current). The charge pump circuit 101 is configured as the circuit according to the first embodiment shown in FIG. 1 or as the circuit according to the second embodiment shown in FIG. 2. The low-pass filter 303 outputs a control voltage according to the output (i.e., the charge or discharge current) from the charge pump circuit 101. The low-pass filter 303 comprises the resistive element 301 connected at one end to the output node 3 of the charge pump circuit 101 and the capacitive element 302 connected between the other end of the resistive element 301 and the ground potential node.

The voltage-controlled oscillation circuit 401 comprises a delay controller and is controlled by a control voltage received from the low-pass filter 303. The voltage-controlled oscillation circuit 401 outputs to the phase-difference comparison circuit 201 the reference clock signal and the comparison clock signal which are out of phase by one cycle with each other, and outputs a plurality of out-of-phase clock signals.

Figure 17:
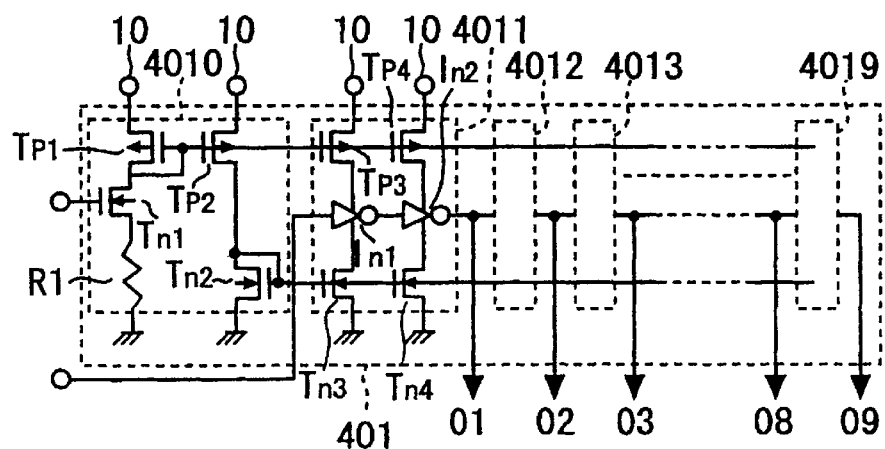
FIG. 17 is a schematic diagram showing a voltage-controlled oscillation circuit 401 provided in the preceding stage PLL circuit 500 shown in FIG. 16.

As shown in FIG. 17, the voltage-controlled oscillation circuit 401 comprises a voltage control circuit 4010 and a plurality of delay circuits (nine delay circuits 4011 through 4019 in the fifth embodiment).

The voltage control circuit 4010 receives a control voltage from the low-pass filter 303 and outputs to the plurality of delay circuits 4011 through 4019 a voltage for specifying a delay time purpose which is controlled by the control voltage. In the fifth embodiment, the delay time controlled by the voltage control circuit 4010 is set to one-eighth of one cycle T of the input clock signal while the preceding stage PLL circuit 500 is in a locked state.

The voltage control circuit 4010 comprises four MOS transistors "Tp1", "Tp2", "Tn1", "Tn2", and one resistive element "R1".

The MOS transistor "Tp1" is a P-type MOS transistor and is connected at its source electrode to the supply voltage node 10. The gate electrode and the drain electrode of the MOS transistor "Tp1" are commonly connected. The gate electrode of the MOS transistor "Tn1" receives the control voltage from the low-pass filter 303. The drain electrode of the MOS transistor "Tn1" is connected to the drain electrode of the MOS transistor "Tp1". The source electrode of the MOS transistor "Tn1" is connected to the ground potential node 20 via the resistive element "R1". The MOS transistor "Tn1" is an N-type MOS transistor, and the conductivity of the MOS transistor "Tn1" changes depending on the control voltage received from the low-pass filter 303. The MOS transistor "Tn1" permits flow of a current controlled by the control voltage from the low-pass filter 303 to the MOS transistor "Tp1". More specifically, while the preceding stage PLL circuit 500 is in a locked state, an electric current which sets the delay time produced by the plurality of delay circuits 4011 through 4019 to T/8 flows through the MOS transistors "Tn1" and "Tp1" due to the control voltage output from the low-pass filter 303. If the clock signal to be compared lags behind the reference clock signal, the control voltage received from the low-pass filter 303 increases. As a result, the electric current flowing through the MOS transistors "Tn1" and "Tp2" changes so as to make the delay time of the plurality of delay circuits 4011 through 4019 shorter than T/8. In contrast, if the clock signal to be compared leads the reference clock signal, the control voltage received from the low-pass filter 303 decreases. Accordingly, in this case, the electric current flowing through the MOS transistors "Tn1" and "Tp2" changes so as to make the delay time of the plurality of delay circuits 4011 through 4019 longer than T/8.

The MOS transistor "Tp2" is a P-type MOS transistor and is connected at its source electrode to the supply voltage node 10 and at its gate electrode to the gate electrode of the MOS transistor "Tp1". The MOS transistor "Tp2" and the MOS transistor "Tp1" constitute a current mirror circuit. An electric current—which has the same value as that of the electric current flowing through the MOS transistor "Tp1"—flows through the MOS transistor "Tp2". The MOS transistor "Tn2" is an N-type MOS transistor, and the gate and drain electrodes of the transistor "Tn2" are commonly connected. The thus commonly connected electrodes are connected to the drain electrode of the MOS transistor "Tp2". The source electrode of the MOS transistor "Tn2" is connected to the ground potential node. The electric current that flows through the MOS transistor "Tn2" has the same value as that of the electric current flowing through the MOS transistor "Tp2". As a result, the electric current, which has the same value as that of the electric current flowing through the MOS transistor "Tn1", flows through the MOS transistor "Tn2".

The delay time (T/8) of the plurality of delay circuits 4011 through 4019 is controlled by the control voltage received from the voltage control circuit 4010. The delay circuits 4011 to 4019 respectively output out-of-phase clock signals O1 to O9 which are out of phase with one another. In the fifth embodiment, the out-of-phase clock signal O1 output from the delay circuit 4011 is imparted to the phase-difference comparison circuit 201 as the reference clock signal. The out-of-phase clock signal O9—which is output from the delay circuit 4019 and is out of phase by one cycle T with the out-of-phase clock signal 1 output from the delay circuit 4011—is imparted to the phase-difference comparison circuit 201 as a clock signal to be compared. The out-of-phase clock signals O1 to O8 output from the delay circuits 4011 to 4018 are imparted respectively to the corresponding selection clock signal generation circuits 801 to 808.

Each of the delay circuits 4011 to 4019 comprises four transistors "Tp3", "Tp4", "Tn3", and "Tn4" and two inverter circuits "In1", "In2".

The MOS transistor "Tp3" is a P-type MOS transistor and is connected at its source electrode to the supply voltage node 10 and at its gate electrode to the gate electrode of the MOS transistor "Tp1". The MOS transistor "Tp3" and the MOS transistor "Tp1" constitute a current mirror circuit. An electric current—which has the same value as that of the electric current flowing through the MOS transistor "Tp1"—flows through the MOS transistor "Tp3". In other words, the electric potential applied to the gate electrode of the MOS transistor "Tp3" is controlled by the voltage control circuit 4010.

The MOS transistor "Tn3" is an N-type MOS transistor and is connected at its source electrode to the ground potential node 20 and at its gate electrode to the gate electrode of the MOS transistor "Tn2". The MOS transistor "Tn3" and the MOS transistor "Tn2" constitute a current mirror circuit. An electric current which has the same value as that of the electric current flowing through the MOS transistor "Tn2" flows through the MOS transistor "Tn3". In other words, the electric potential applied to the gate electrode of the MOS transistor "Tn3" is controlled by the voltage control circuit 4010.

An inverter circuit "In1" is connected between the drain electrode of the MOS transistor "Tp3" and the drain electrode of the MOS transistor "Tn3". The inverter circuit "In1" comprises a P-type MOS transistor and an N-type MOS transistor which are connected in series. The gate electrodes of the P-type and N-type MOS transistors are commonly connected, serving as an input node. A node between these transistors serves as an output node.

The MOS transistor "Tp3", the MOS transistor "Tn3", and the inverter circuit "In1" constitute a preceding stage inverter circuit.

The MOS transistor "Tp4" is a P-type MOS transistor and is connected at its source electrode to the supply voltage node 10 and at its gate electrode to the gate electrode of the MOS transistor "Tp1". The MOS transistor "Tp4" and the MOS transistor "Tp1" constitute a current mirror circuit. An electric current which has the same value as that of the electric current flowing through the MOS transistor "Tp1" flows through the MOS transistor "Tp4". In other words, the electric potential applied to the gate electrode of the MOS transistor "Tp4" is controlled by the voltage control circuit 4010.

The MOS transistor "Tn4" is an N-type MOS transistor and is connected at its source electrode to the ground potential node 20 and at its gate electrode to the gate electrode of the MOS transistor "Tn2". The MOS transistor "Tn4" and the MOS transistor "Tn2" constitute a current mirror circuit, and an electric current—which has the same value as that of the electric current flowing through the MOS transistor "Tn2"—flows through the MOS transistor "Tn4". In other words, the electric potential applied to the gate electrode of the MOS transistor "Tn4" is controlled by the voltage control circuit 4010.

An inverter circuit "In2" is connected between the drain electrode of the MOS transistor "Tp4" and the drain electrode of the MOS transistor "Tn4". The inverter circuit "In2" comprises a P-type MOS transistor and a N-type MOS transistor which are connected in series. The gate electrodes of the P-type and N-type MOS transistors are commonly connected, and serving as an input node. A node between these transistors serves as an output node. The input node of the inverter circuit "In2" is connected to the output node of the inverter circuit "In1".

The MOS transistor "Tp4", the MOS transistor "Tn4", and the inverter circuit "In2" constitute a subsequent stage inverter circuit.

In the fifth embodiment, each of the delay circuits 4011 through 4019 comprises the preceding stage inverter circuit and the subsequent stage inverter circuit. In other wards, each of the delay circuits 4011 through 4019 comprises two inverter circuits. However, the number of the inverter circuits included in the delay circuits is not limited to two. Namely, the delay circuits may be formed from an even number of inverter circuits.

The input node of the inverter circuit "In1" of the delay circuit 401 in the first stage receives an input clock signal. The input node of the inverter circuit "In1" of one of the delay circuits 4012 through 4019 in the stages subsequent to the first stage is connected to the output node of the inverter circuit "In2" of one of the delay circuits 4011 through 4018 in the preceding stage. The output node of the inverter circuit "In2" in the first delay circuit 4011 is also connected to the node of the phase-difference comparison circuit 201 to which the reference clock signal is input. The output node of the inverter circuit "In2" of the delay circuit 4019 in the final stage is connected to the node of the phase-difference comparison circuit 201 to which the clock signal to be compared is input. The output node of the inverter circuit "In2" of each of the delay circuits 4011 to 4018 is connected to the clock signal input node of the corresponding one of the selection clock signal generation circuits 801 to 808.

The frequency division circuit 600 shown in FIG. 15 divides the input clock signal and outputs a frequency-divided clock signal. In the fifth embodiment, the frequency division circuit 600 divides the input clock signal into 2/7. Thus, one cycle T1 of the frequency-divided clock signal is 49 ns (=T×7/2=14×7/2).

The subsequent stage PLL circuit 700 shown in FIG. 15 receives the frequency-divided clock signal from the frequency division circuit 600 and outputs a delay-time setting voltage signal to the selection clock signal generation circuits 801 to 808.

Figure 18:
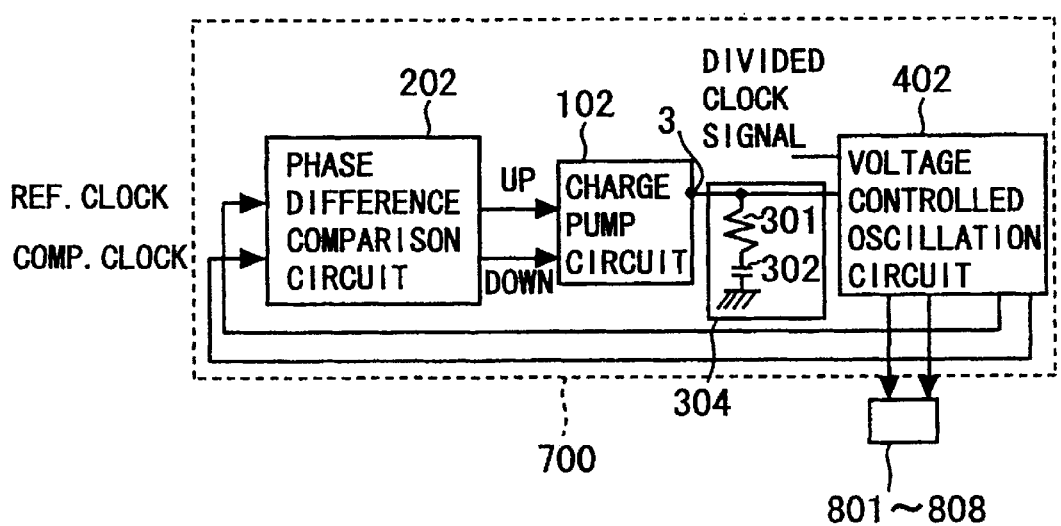
FIG. 18 is a block diagram showing a subsequent stage PLL circuit 700 provided in the waveform generation circuit 1000 shown in FIG. 15.

The preceding stage PLL circuit 700 is the same in basic configuration as the PLL circuit according to the fourth embodiment shown in FIG. 12. As shown in FIG. 18, the preceding stage PLL circuit 700 comprises a phase-difference comparison circuit 202, a charge pump circuit 102, a low-pass filter 304, and a voltage-controlled oscillation circuit 402.

The phase-difference comparison circuit 202 outputs an "UP" or "DOWN" signal on the basis of the phase difference between the reference clock signal and a clock signal to be compared. Upon receipt of the "UP" or "DOWN" signal from the phase-difference comparison circuit 202, the charge pump circuit 102 outputs an output current (or a charge or discharge current). The charge pump circuit 102 is configured as the circuit according to the first embodiment shown in FIG. 1 or as the circuit according to the second embodiment shown in FIG. 2. The low-pass filter 304 outputs a control voltage according to the output (i.e., the charge or discharge current) from the charge pump circuit 102. The low-pass filter 304 comprises the resistive element 301 connected at one end to the output node 3 of the charge pump circuit 102 and the capacitive element 302 connected between the other end of the resistive element 301 and the ground potential node.

The voltage-controlled oscillation circuit 402 comprises a delay controller and is controlled by a control voltage received from the low-pass filter 304. The voltage-controlled oscillation circuit 402 outputs to the phase-difference comparison circuit 202 the reference clock signal and the comparison clock signal which are out of phase with each other by one cycle, and outputs the delay time setting voltage signal to the selection clock signal generation circuits 801 to 808.

Figure 19:
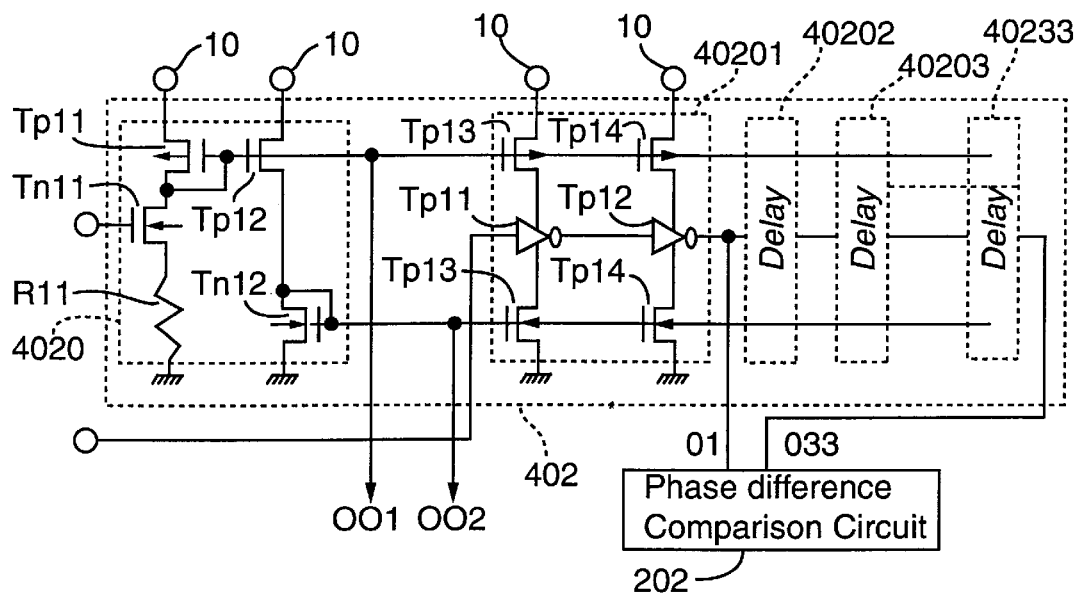
FIG. 19 is a schematic diagram showing a voltage-controlled oscillation circuit 402 provided in the preceding stage PLL circuit 700 shown in FIG. 16.

As shown in FIG. 19, the voltage-controlled oscillation circuit 402 comprises a voltage control circuit 4020 and a plurality of delay circuits (33 delay circuits 40201 through 40233 in the fifth embodiment).

The voltage control circuit 4020 receives a control voltage from the low-pass filter 304 and outputs to the plurality of delay circuits 40201 through 40233 a voltage which is controlled by the control voltage and determines a delay time of the delay circuits. In the fifth embodiment, the delay time controlled by the voltage control circuit 4020 is set to one-thirty-second of one cycle T1 of the frequency-divided clock signal received from the frequency division circuit 600, i.e., (2/7)×T/32, while the preceding stage PLL circuit 700 is in a locked state.

The voltage control circuit 4020 comprises four MOS transistors "Tp11", "Tp12", "Tn11", "Tn12", and one resistive element "R11".

The MOS transistor "Tp11" is a P-type MOS transistor and is connected at its source electrode to the supply voltage node 10. The gate electrode and the drain electrode of the MOS transistor "Tp11" are commonly connected. The gate electrode of the MOS transistor "Tn11" receives the control voltage from the low-pass filter 304, and the drain electrode of the MOS transistor "Tn11" is connected to the drain electrode of the MOS transistor "Tp11". The source electrode of the MOS transistor "Tn11" is connected to the ground potential node 20 via the resistive element "R11". The MOS transistor "Tn11" is an N-type MOS transistor, and the conductivity of the MOS transistor "Tn11" changes depending on the control voltage received from the low-pass filter 304. The MOS transistor "Tn11" permits flow of a current controlled by the control voltage from the low-pass filter 304 through the MOS transistor "Tp11". More specifically, while the subsequent stage PLL circuit 700 is in a locked state, an electric current which set the delay time of the plurality of delay circuits 40201 through 40233 to (2/7)×T/32 flows through the MOS transistors "Tn11" and "Tp11" due to the control voltage received from the low-pass filter 304. If the clock signal to be compared lags behind the reference clock signal, the control voltage received from the low-pass filter 304 increases. As a result, the electric current flowing through the MOS transistors "Tn11" and "Tp11" changes so as to make the delay time of the plurality of delay circuits 402011 through 40233 shorter than (7/2)× T/32. In contrast, if the clock signal to be compared leads the reference clock signal, the control voltage received from the low-pass filter 304 decreases. As a result, the electric current flowing through the MOS transistors "Tn11" and "Tp11" changes so as to make the delay time of the plurality of delay circuits 40201 through 40233 longer than (7/2)×T/32.

The MOS transistor "Tp12" is a P-type MOS transistor and is connected at its source electrode to the supply voltage node 10 and at its gate electrode to the gate electrode of the gate electrode of the MOS transistor "Tp11". The MOS transistor "Tp12" and the MOS transistor "Tp11" constitute a current mirror circuit. An electric current—which has the same value as that of the electric current flowing through the MOS transistor "Tp11"—flows through the MOS transistor "Tp12". The MOS transistor "Tn12" is an N-type MOS transistor, and at its gate and drain electrodes are connected commonly. The commonly connected electrodes are connected to the drain electrode of the MOS transistor "Tp12". The source electrode of the MOS transistor "Tn12" is connected to the ground potential node. The electric current that flows through the MOS transistor "Tn12" has the same value as that of the electric current flowing through the MOS transistor "Tp12". As a result, the electric current, which has the same value as that of the electric current flowing through the MOS transistor "Tn11", flows through the MOS transistor "Tn12".

The electric potential appearing in the gate electrode of the MOS transistor "Tp11" and the electric potential appearing in the gate electrode of the MOS transistor "Tn12" are output to the selection clock signal generation circuits 801 to 809 as delay time setting voltage signals OO1 and OO2.

The delay time $\{(7/2)\times T/32\}$ of the plurality of delay circuits 40201 through 40233 is controlled by the control voltage received from the voltage control circuit 4020. In the fifth embodiment, an out-of-phase clock signal O1 output from the delay circuit 40201 in the first stage is imparted to the phase-difference comparison circuit 202 as the reference clock signal. An out-of-phase clock signal O33—which is output from the delay circuit 40233 in the final stage and is out of phase by one cycle T with the out-of-phase clock signal O1 output from the delay circuit 40201—is imparted to the phase-difference comparison circuit 202 as a clock signal to be compared.

Each of the delay circuits 40201 through 40233 comprises four transistors "Tp13", "Tp14", "Tn13", and "Tn14" and two inverter circuits "In11", "In12". The MOS transistor "Tp13" is a P-type MOS transistor and is connected at its source electrode to the supply voltage node 10 and at its gate electrode to the gate electrode of the MOS transistor "Tp11". The MOS transistor "Tp13" and the MOS transistor "Tp11" constitute a current mirror circuit. An electric current— which has the same value as that of the electric current flowing through the MOS transistor "Tp11"—flows through the MOS transistor "Tp13". In short, the electric potential applied to the gate electrode of the MOS transistor "Tp13" is controlled by the voltage control circuit 4020.

The MOS transistor "Tn13" is an N-type MOS transistor and is connected at its source electrode to the ground potential node 20 and at its gate electrode to the gate electrode of the MOS transistor "Tn12". The MOS transistor "Tn13" and the MOS transistor "Tn12" constitute a current mirror circuit. An electric current—which has the same value as that of the electric current flowing through the MOS transistor "Tn12"—flows through the MOS transistor "Tn13". In other words, the electric potential applied to the gate electrode of the MOS transistor "Tn13" is controlled by the voltage control circuit 4020.

An inverter circuit "In11" is connected between the drain electrode of the MOS transistor "Tp13" and the drain electrode of the MOS transistor "Tn13". The inverter circuit "In11" comprises a P-type MOS transistor and an N-type MOS transistor which are connected in series. The gate electrodes of the P-type and N-type MOS transistors are commonly connected, and serving as an input node. A node between these transistors serves as an output node.

The MOS transistor "Tp13", the MOS transistor "Tn13", and the inverter circuit "In11" constitute a preceding stage inverter circuit.

The MOS transistor "Tp14" is a P-type MOS transistor and is connected at its source electrode to the supply voltage node 10 and at its gate electrode to the gate electrode of the MOS transistor "Tp11". The MOS transistor "Tp14" and the MOS transistor "Tp11" constitute a current mirror circuit. An electric current—which has the same value as that of the electric current flowing through the MOS transistor "Tp11"—flows through the MOS transistor "Tp14". In other words, the electric potential applied to the gate electrode of the MOS transistor "Tp14" is controlled by the voltage control circuit 4020.

The MOS transistor "Tn14" is an N-type MOS transistor and is connected at its source electrode to the ground potential node 20 and at its gate electrode to the gate electrode of the MOS transistor "Tn12". The MOS transistor "Tn14" and the MOS transistor "Tn12" constitute a current mirror circuit. An electric current—which has the same value as that of the electric current flowing through the MOS transistor "Tn12"—flows through the current mirror circuit. In other words, the electric potential applied to the gate electrode of the MOS transistor "Tn14" is controlled by the voltage control circuit 4020.

An inverter circuit "In12" is connected between the drain electrode of the MOS transistor "Tp14" and the drain electrode of the MOS transistor "Tn14". The inverter circuit "In12" comprises a P-type MOS transistor and N-type MOS transistor which are connected in series. The gate electrodes of the P-type and N-type MOS transistors are commonly connected, and serving as an input node. A node between these transistors serves as an output node. The input node of the inverter circuit "In12" is connected to the output node of the inverter circuit "In11".

The MOS transistor "Tp14", the MOS transistor "Tn14", and the inverter circuit "In12" constitute a subsequent stage inverter circuit.

In the fifth embodiment, although each of the delay circuits 40201 through 40233 comprises the preceding stage inverter circuit and the subsequent stage inverter circuit, the delay circuit may alternately be formed from an even number of inverter circuits.

The inverter circuit "I"N11 of the delay circuit 40201 in the first stage receives the frequency-divided clock signal from the frequency division circuit 600 at its input node. The input node of the inverter circuit "In11" of one of the delay circuits 40202 through 40233 in the stages subsequent to the first stage is connected to the output node of the inverter circuit "In12" of one of the delay circuits 40201 through 40232 in the preceding stage. The output node of the inverter circuit "In12" in the first delay circuit 40201 is also connected to the node of the phase-difference comparison circuit 202 to which the reference clock signal is input. The output node of the inverter circuit "In12" of the delay circuit 40233 in the final stage is connected to the node of the phase-difference comparison circuit 202 to which the clock signal to be compared is input.

The selection clock signal generation circuits 801 through 808 shown in FIG. 15 are provided so as to correspond to the plurality of out-of-phase clock signals output from the preceding stage PLL circuit 500, and each of the circuits 801 through 808 comprises a delay controller. On the basis of the delay time setting voltage signal received from the subsequent stage PLL circuit 700, the selection clock signal generation circuits 801 through 808 shown in FIG. 15 produce a plurality of selection clock signals by delaying the corresponding out-of-phase clock signals output from the preceding stage PLL circuit 500 by a given time interval. The thus-produced selection clock signals are output to the waveform selection circuit 2000. In the fifth embodiment, there are provided eight selection clock signal generation circuits 801 through 808, and the delay time of each of the selection clock signal generation circuits 801 through 808 is set to 1/64(=1/8−(7/2)/32) of one cycle T of the input clock signal.

Figure 20:
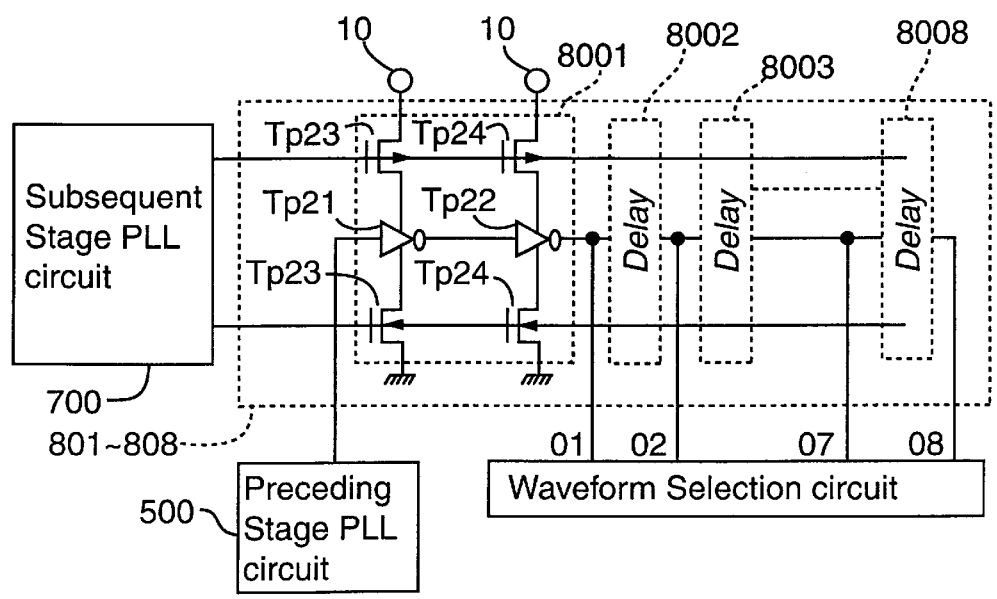
FIG. 20 is a schematic diagram showing selection clock signal generation circuits 801 to 808 provided in the waveform generation circuit 1000 shown in FIG. 15.
Figure 21:
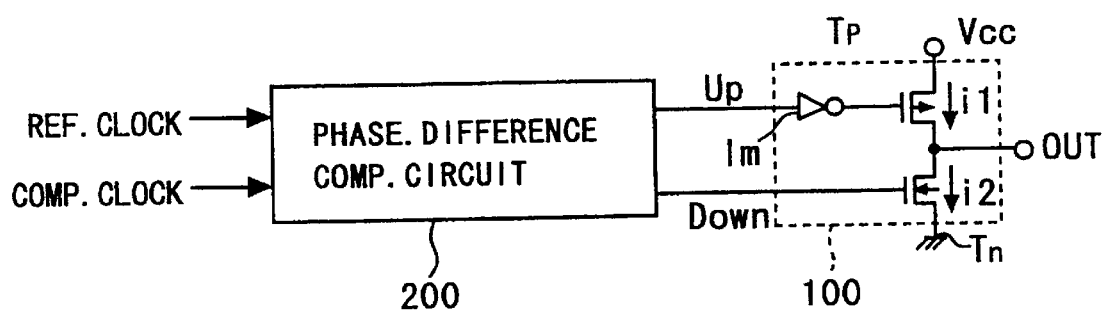
FIG. 21 is a block diagram showing an existing charge pump circuit 100.
Figure 22:
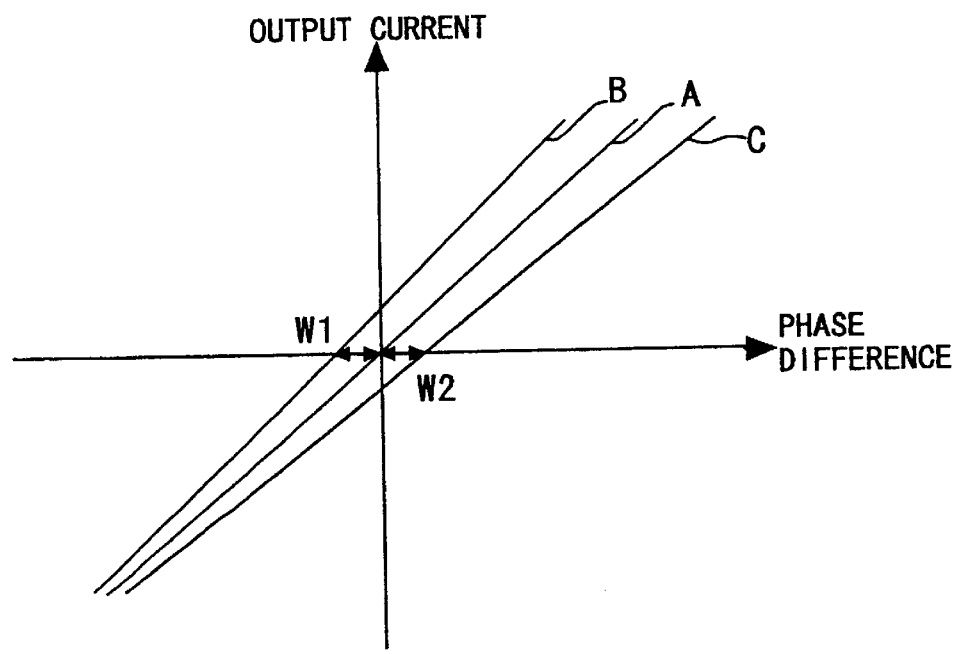
FIG. 22 is a plot showing a relationship between the phase difference between the reference clock signal and the clock signal to be compared, which stems from variations in a manufacturing process, and the electric current output from the charge pump circuit shown in FIG. 21.

As shown in FIG. 20, each of the selection clock signal generation circuits 801 through 808 comprises a plurality of stages (e.g., eight delay circuits 8001 to 8008 in the fifth embodiment).

The delay time (T/64(=T/8−(7/2)×T/32)) of the plurality of delay circuits 8001 through 8008 is controlled by means of the delay time setting voltage signals OO1 and OO2 received from the subsequent stage PLL circuit 700. The delay circuits 8001 through 800 output selection clock signals O1 through O8 to the waveform selection circuit 2000.

Each of the delay circuits 8001 through 8008 comprises four transistors "Tp23", "Tp24", "Tn23", and "Tn24" and two inverter circuits "In21", "In22".

The MOS transistor "Tp23" is a P-type MOS transistor and is connected at its source electrode to the supply voltage node 10. The gate electrode of the MOS transistor "Tp23" receives the delay time setting voltage signal OO1 from the subsequent stage PLL circuit 700, and the current flowing through the MOS transistor "Tp23" is controlled by the signal OO1. More specifically, the gate electrode of the MOS transistor "Tp23" is connected to the gate electrode of the MOS transistor "Tp11" of the voltage control circuit 4020 of the subsequent stage PLL circuit 700. As a result, the MOS transistor "Tp23" and the MOS transistor "Tp11" constitute a current mirror circuit, and an electric current— which has the same value as that of the electric current flowing through the MOS transistor "Tp11"—flows through the MOS transistor "Tp23". In other words, the electric potential applied to the gate electrode of the MOS transistor "Tp23" is controlled by the voltage control circuit 4020.

The MOS transistor "Tn23" is an N-type MOS transistor and is connected at its source electrode to the ground potential node 20. The gate electrode of the MOS transistor "Tn23" receives the delay time setting voltage signal OO2 from the subsequent stage PLL circuit 700, and the current flowing through the MOS transistor "Tn23" is controlled by the signal OO2. More specifically, the gate electrode of the MOS transistor "Tn23" is connected to the gate electrode of the MOS transistor "Tn12" of the voltage control circuit 4020 of the subsequent stage PLL circuit 700. As a result, the MOS transistor "Tn23" and the MOS transistor "Tn"12 constitute a current mirror circuit. An electric current— which has the same value as that of the electric current flowing through the MOS transistor "Tn12"—flows through the MOS transistor "Tn23". In other words, the electric potential applied to the gate electrode of the MOS transistor "Tn23" is controlled by the voltage control circuit 4020.

An inverter circuit "In21" is connected between the drain electrode of the MOS transistor "Tp23" and the drain electrode of the MOS transistor "Tn23". The inverter circuit "In21" comprises a P-type MOS transistor connected in series with the N-type MOS transistor. The gate electrodes of the P-type and N-type MOS transistors are commonly connected, and serving as an input node. A node between these transistors serves as an output node.

The MOS transistor "Tp23", the MOS transistor "Tn2"3, and the inverter circuit "In21" constitute a preceding stage inverter circuit.

The MOS transistor "Tp24" is a P-type MOS transistor and is connected at its source electrode to the supply voltage node 10. The gate electrode of the MOS transistor "Tp24" receives the delay time setting voltage signal OO1 from the subsequent stage PLL circuit 700, and the current flowing through the MOS transistor "Tp24" is controlled by the signal OO1. More specifically, the gate electrode of the MOS transistor "Tp24" is connected to the gate electrode of the MOS transistor "Tp11" of the voltage control circuit 4020 of the subsequent stage PLL circuit 700. As a result, the MOS transistor "Tp24" and the MOS transistor "Tp11" constitute a current mirror circuit, and an electric current— which has the same value as that of the electric current flowing through the MOS transistor "Tp11"—flows through the MOS transistor "Tp24". In other words, the electric potential applied to the gate electrode of the MOS transistor "Tp24" is controlled by the voltage control circuit 4010.

The MOS transistor "Tn24" is an N-type MOS transistor and is connected at its source electrode to the ground potential node 20. The gate electrode of the MOS transistor "Tn24" receives the delay time setting voltage signal OO2 from the subsequent stage PLL circuit 700, and the current flowing through the MOS transistor "Tn24" is controlled by the signal OO2. More specifically, the gate electrode of the MOS transistor "Tn24" is connected to the gate electrode of the MOS transistor "Tn12" of the voltage control circuit 4020 of the subsequent stage PLL circuit 700. As a result, the MOS transistor "Tn24" and the MOS transistor "Tn12" constitute a current mirror circuit, and an electric current— which has the same value as that of the electric current flowing through the MOS transistor "Tn12"—flows through the MOS transistor "Tn24". In other words, the electric potential applied to the gate electrode of the MOS transistor "Tn24" is controlled by the voltage control circuit 4020.

An inverter circuit "In22" is connected between the drain electrode of the MOS transistor "Tp24" and the drain electrode of the MOS transistor "Tn24". The inverter circuit "In22" comprises a P-type MOS transistor and an N-type MOS transistor which are connected in series. The gate electrodes of the P-type and N-type MOS transistors are commonly connected, and serving as an input node. A node between these transistors serves as an output node. The input node of the inverter circuit "In22" is connected to the output node of the inverter circuit "In21".

The MOS transistor "Tp24", the MOS transistor "Tn24", and the inverter circuit "In22" constitute a subsequent stage inverter circuit.

In the fifth embodiment, although each of the delay circuits 8001 through 8008 comprises the preceding stage inverter circuit and the subsequent stage inverter circuit, the delay circuit may alternately be formed from an even number of inverter circuits.

The input node of the inverter circuit "In21" of the delay circuit 8001 in the first stage receives a corresponding out-of-phase clock signal from the preceding stage PLL circuit 500. The input node of the inverter circuit "In21" of one of the delay circuits 8002 through 8008 in the stages subsequent to the first stage is connected to the output node of the inverter circuit "In22" of one of the delay circuits 8001 through 8007 in the preceding stage. The selection clock signals O1 through O8 are output to the waveform selection circuit 2000 from the output node of the respective inverter circuit "In22" of each of delay circuits 8001 through 8008.

In the pulse-width modulation circuit having the configuration mentioned previously, as has been already described in the fourth embodiment, the charge pump circuit 101 constituting the preceding stage PLL circuit 500 produces an output of substantially zero when the phase difference between the reference clock signal and the clock signal to be compared, both being input to the phase-difference comparison circuit 201, is zero, without regard to variations in a manufacturing process, variations in supply voltage, or differences in operating temperature. Therefore, there is yielded a margin in timing design of the preceding stage PLL circuit 500. As a result, the voltage-controlled oscillation circuit 401 of the preceding stage PLL circuit 500 can output a plurality of out-of-phase clock signals with a high-frequency which is suitable for high-speed operation to the selection clock signal generation circuits 801 through 808 while the phase difference of the plurality of the out-of-phase clock signals is highly accurately ensured.

Further, as has already been described in the fourth embodiment, the charge pump circuit 102 constituting the subsequent stage PLL circuit 700 produces an output of substantially zero when the phase difference between the reference clock signal and the clock signal to be compared, both being input to the phase-difference comparison circuit 202, is zero, without regard to variations in a manufacturing process, variations in supply voltage, or differences in operating temperature. Therefore, there is yielded a margin of timing in designing the preceding stage PLL circuit 700. As a result, the voltage control circuit 4020 of the voltage-controlled oscillation circuit 402 in the subsequent stage PLL circuit 700 can output delay time setting voltage signals for determining the phase difference among the plurality of the selection clock signals from the selection clock signal generation circuits 801 through 808 to the circuits 801 through 808 while the delay time setting voltage signal is highly accurately ensured.

Accordingly, the selection clock signal generation circuits 801 through 808 which receive the high-frequency out-of-phase clock signals from the preceding stage PLL circuit 500 and the highly-accurate delay time setting voltage signals from the subsequent stage PLL circuit 700 can output a plurality of selection clock signals having a high-frequency which is suitable for high-speed operation to the waveform selection circuit 2000 while the phase differences among the selection clock signals are highly accurately ensured.

Therefore, the waveform selection circuit 2000 can highly accurately produce very many pulse widths. The pulse-width modulation circuit having the foregoing configuration has the effect of being able to produce a highly-accurate pulse-width modulated output corresponding to many data signals (in the form of digital signals).

Further, the present invention is not limited to these embodiments, but variations and modifications may be made without departing from the scope of the present invention.

What is claimed is:

1. A charge pump circuit comprising:
    a charge current generation circuit including:
        a supply voltage node to which a supply voltage is applied;
        a ground potential node to which a ground potential is applied;
        a first input node for receiving a first input signal;
        a second input node for receiving a second input signal;
        an output node through which a charge or discharge current flows;
        a first MOS transistor having a first conductivity type connected at the gate electrode thereof to said first input node, and connected at the source electrode thereof to said supply voltage node; and
        a second MOS transistor having the first conductivity type, receiving at the gate electrode thereof a first electric potential, and connected between the drain electrode of said first MOS transistor and said output node;
    a discharge current generation circuit including:
        a third MOS transistor having the first conductivity type, connected at the gate electrode thereof to said second input node, and connected at the source electrode thereof to said supply voltage node;
        a fourth MOS transistor having the first conductivity type, connected at the gate electrode thereof to the gate electrode of said second MOS transistor, and connected at the source electrode thereof to the drain electrode of said third MOS transistor; and
    a current mirror circuit having input circuitry connected to the drain electrode of said fourth MOS transistor and through which an input current flows, said input circuitry including
        a fifth MOS transistor having a second conductivity type, receiving at the gate electrode thereof a second electric potential, and connected at the drain electrode thereof to the drain electrode of said fourth MOS transistor; and
        a sixth MOS transistor having the second conductivity type, connected at the gate electrode thereof to the drain electrode of said fifth MOS transistor, and connected between the source electrode of said fifth MOS transistor and said ground potential node; and
    output circuitry connected to said output node and through which an output current, corresponding to the input current flowing through the input circuitry, flows, said output circuitry including
        a seventh MOS transistor having the second conductivity type, connected at the sate electrode thereof to the gate electrode of said fifth MOS transistor, and connected at the drain electrode thereof to the output node; and
        an eighth MOS transistor having the second conductivity type, connected at the gate electrode thereof to the gate electrode of said sixth MOS transistor, and connected between the source electrode of said seventh MOS transistor and said ground potential node.

2. The charge pump circuit as defined in claim 1, wherein:
    said charge current generation circuit has a first resistive element connected between the drain electrode of said second MOS transistor and said output node; and the discharge current generation circuit comprises:
    a second resistive element connected between the drain electrode of said fourth MOS transistor and the drain electrode of said fifth MOS transistor;
    a third resistive element connected between the source electrode of said fifth MOS transistor and the drain electrode of said sixth MOS transistor; and
    a fourth resistive element connected between the source electrode of said seventh MOS transistor and the drain electrode of said eighth MOS transistor.

3. The charge pump circuit as defined in claim 1, wherein:
said charge current generation circuit comprises a first capacitive element connected between said supply voltage node and the drain electrode of said first MOS transistor; and
said discharge current generation circuit comprises a second capacitive element connected between said supply voltage node and the drain electrode of said third MOS transistor.

4. The charge pump circuit as defined in claim 1, further comprising a first voltage generation circuit connected between the supply voltage node and said ground potential node and which outputs said first electric potential to a first potential output node connected to the gate electrodes of said second and fourth MOS transistors.

5. The charge pump circuit as defined in claim 4, wherein the channel length of said second MOS transistor is longer than that of said first MOS transistor, and the channel length of said fourth MOS transistor is longer than that of said third MOS transistor.

6. The charge pump circuit as defined in claim 4, wherein channel width of said second MOS transistor is wider than that of said fourth MOS transistor.

7. The charge pump circuit as defined in claim 4, further comprising a second voltage generation circuit connected between said supply voltage node and said ground potential node and which outputs a second voltage to a second potential output node.

8. The charge pump circuit as defined in claim 7, wherein:
said charge current generation circuit has a first resistive element connected between the drain electrode of said second MOS transistor and said output node; and
said discharge current generation circuit comprises:
    a second resistive element connected between the drain electrode of said fourth MOS transistor and the drain electrode of said fifth MOS transistor;
    a third resistive element connected between the source electrode of said fifth MOS transistor and the drain electrode of said sixth MOS transistor; and
    a fourth resistive element connected between the source electrode of said seventh MOS transistor and the drain electrode of said eighth MOS transistor.

9. The charge pump circuit as defined in claim 4, wherein:
said charge current generation circuit comprises a first capacitive element connected between said supply voltage node and the drain electrode of said first MOS transistor; and
said discharge current generation circuit comprises a second capacitive element connected between said supply voltage node and the drain electrode of said third MOS transistor.

10. The charge pump circuit as defined in claim 7, wherein said first voltage generation circuit comprises:
    a ninth MOS transistor having the first conductivity type, connected between said supply voltage node and said first potential output node, and connected at its gate electrode to said first potential output node; and
    a first resistive element connected between said first potential output node and said ground potential node.

11. The charge pump circuit as defined in claim 10, wherein said first voltage generation circuit comprises a capacitive element connected between said supply voltage node and said first potential output node.

12. The charge pump circuit as defined in claim 10, wherein said second voltage generation circuit comprises:
    a second resistive element connected between said supply voltage node and said second potential output node; and
    a tenth MOS transistor having the second conductivity type, connected between said second potential output node and said ground potential node, and connected at the gate electrode thereof to said second potential output node.

13. The charge pump circuit as defined in claim 12, wherein said second voltage generation circuit comprises a capacitive element connected between said second potential output node and said ground potential node.

14. A PLL circuit comprising:
    a phase-difference comparison circuit which outputs an UP or DOWN signal based on a phase difference between a reference clock signal and a clock signal;
    a charge pump circuit receiving the UP or DOWN signal from said phase-difference comparison circuit and outputting a charge or discharge current;
    a low-pass filter outputting a control voltage according to an output from said charge pump circuit;
    a voltage-controlled oscillation circuit outputting a clock signal controlled by the control voltage received from said low-pass filter to said phase-difference comparison circuit as the clock signal,
    said charge pump circuit including:
        a first input node for receiving the UP signal from said phase-difference comparison circuit;
        a second input node for receiving the DOWN signal from said phase-difference comparison circuit;
        an output node connected to an input node of said low-pass filter;
        a first MOS transistor having a first conductivity type, connected at the gate electrode thereof to the first input node, and connected at the source electrode thereof to a supply voltage node having a supply voltage applied thereto;
        a second MOS transistor having the first conductivity type, receiving at the gate electrode thereof an electric potential, and connected between the drain electrode of said first MOS transistor and said output node;
        a third MOS transistor having the first conductivity type, connected at the gate electrode thereof to said second input node, and connected at the source electrode thereof to said supply voltage node;
        a fourth MOS transistor having the first conductivity type, connected at the gate electrode thereof to the gate electrode of said second MOS transistor, and connected at the source electrode thereof to the drain electrode of said third MOS transistor; and
    a current mirror circuit having input circuitry connected to the drain electrode of said fourth MOS transistor and through which an input current flows, said input circuitry including
        a fifth MOS transistor having a second conductivity type, receiving at the gate electrode thereof a second electric potential, and connected at the drain electrode thereof to the drain electrode of said fourth MOS transistor; and a sixth MOS transistor having the second conductivity type, connected at the gate electrode thereof to the drain electrode of said fifth MOS transistor, and connected between the source electrode of said fifth MOS transistor and said ground potential node; and output circuitry connected to said output node and through which an output current, corresponding to the input current flowing through the input circuitry, flows, said output circuitry including a seventh MOS transistor having the second conductivity type, connected at the gate electrode thereof to the gate electrode of said fifth MOS transistor, and connected at the drain electrode thereof to the output node; and an eighth MOS transistor having the second conductivity type, connected at the gate electrode thereof to the gate electrode of said sixth MOS transistor, and connected between the source electrode of said seventh MOS transistor and said ground potential node.

15. The PLL circuit as defined in claim 14, wherein:

said charge pump circuit has a voltage generation circuit which imparts an electric potential to the gate electrode of said second MOS transistor; and said voltage generation circuit includes:
a potential output node for outputting the electric potential;
a ninth MOS transistor connected between said supply voltage node and said potential output node;
a resistive element connected between said potential output node and a ground potential node having a ground potential applied thereto; and
a capacitive element connected between said supply voltage node and said potential output node.

16. The PLL circuit as defined in claim 14, wherein said voltage-controlled oscillation circuit comprises a ring oscillator.

17. The PLL circuit as defined in claim 14, wherein said voltage-controlled oscillation circuit comprises a delay controller.

18. A pulse-width modulation circuit comprising:
a waveform generation circuit receiving an input clock signal and outputting, based on the input clock signal, a plurality of clock signals for selection purposes and which are out of phase with one another by an offset; and
a waveform selection circuit receiving the plurality of clock signals from the waveform generation circuit and a selection signal, selecting two clock signals from the plurality of clock signals based on the selection signal received, subjecting the two clock signals selected to an AND operation, and outputting the AND operation result as a pulse-width modulated output signal, wherein:

said waveform generation circuit includes:
a preceding stage phase lock loop(PLL) circuit which outputs a plurality of out-of-phase clock signals, each out-of-phase clock signal being out of phase with the input clock signal by an offset;
a frequency division circuit which outputs a frequency-divided clock signal by dividing the frequency of the input clock signal;
a subsequent stage PLL circuit which receives the frequency-divided clock signal from the frequency division circuit and outputs a delay time setting voltage signal; and selection clock signal generation circuits respectively corresponding to the plurality of out-of-phase clock signals received from said preceding stage PLL circuit and which output to the waveform selection circuit the plurality of clock signals by delaying the corresponding out-of-phase clock signals at a time interval, on the basis of the delay time setting voltage signal from said subsequent stage PLL circuit;

the preceding stage PLL circuit includes:
a phase-difference comparison circuit outputting an UP or DOWN signal based on a phase difference between the reference clock signal and a clock signal;
a charge pump circuit which receives the UP or DOWN signal from said phase-difference comparison circuit and outputs a charge or discharge current;
a low-pass filter which outputs a control voltage according to an output from the charge pump circuit; and
a voltage-controlled oscillation circuit controlled by the control voltage received from said low-pass filter, which outputs to the phase-difference comparison circuit the reference clock signal and the clock signal, the two signals being out of phase with each other by one cycle, and which outputs said plurality of out-of-phase clock signals;

the charge pump circuit includes:
a first input node for receiving the UP signal from the phase-difference comparison circuit;
a second input node for receiving the DOWN signal from the phase-difference comparison circuit;
an output node connected to an input node of said low-pass filter;
a first MOS transistor having a first conductivity type, connected at the gate electrode thereof to said first input node, and connected at the source electrode thereof to a supply voltage node having a supply voltage applied thereto;
a second MOS transistor having the first conductivity type, receiving at the gate electrode thereof an electric potential, and connected between the drain electrode of said first MOS transistor and said output node;
a third MOS transistor having the first conductivity type, connected at the gate electrode thereof to said second input node, and connected at the source electrode thereof to said supply voltage node;
a fourth MOS transistor having the first conductivity type, connected at the gate electrode thereof to the gate electrode of said second MOS transistor, and connected at the source electrode thereof to the drain electrode of said third MOS transistor; and
a current mirror circuit having input circuitry connected to the drain electrode of said fourth MOS transistor and through which an input current flows, said input circuitry including:
a fifth MOS transistor having a second conductivity type, receiving at the gate electrode thereof a second electric potential, and connected at the drain electrode thereof to the drain electrode of said fourth MOS transistor; and
a sixth MOS transistor having the second conductivity type, connected at the gate electrode thereof to the drain electrode of said fifth MOS transistor, and connected between the source electrode of said fifth MOS transistor and said ground potential node; and
output circuitry connected to said output node and through which an output current corresponding to the input current flowing through said input circuitry, flow, said output circuitry including
a seventh MOS transistor having the second conductivity type, connected at the gate electrode thereof to the gate electrode of said fifth MOS transistor, and connected at the drain electrode thereof to the output node; and
an eighth MOS transistor having the second conductivity type, connected at the gate electrode thereof to the gate electrode of said sixth MOS transistor, and connected between the source electrode of said seventh MOS transistor and said ground potential node; and the voltage-controlled oscillation circuit includes:
a voltage control circuit which receives a control voltage from said low-pass filter and which outputs the delay time setting voltage signal; and
a plurality of cascaded delay means controlled by the delay time setting voltage signal received from the voltage control circuit, wherein the delay means in a first stage receives the input clock signal, outputs from the plurality of delay means are output as the plurality of out-of-phase clock signals, and two delay means of the plurality of delay means output to said phase-difference comparison circuit, as the reference clock signal and the clock signal, clock signals out of phase by one cycle with each other.

19. The pulse-width modulation circuit as defined in claim 18, wherein the subsequent stage PLL circuit includes:
a phase-difference comparison circuit which outputs an UP or DOWN signal on the basis of a phase difference between the reference clock signal and a clock signal;
a charge pump circuit which receives the UP or DOWN signal from said phase-difference comparison circuit and outputs a charge or discharge current;
a low-pass filter which outputs a control voltage according to an output from said charge pump circuit; and
a voltage-controlled oscillation circuit which is controlled by the control voltage received from said low-pass filter, which outputs to said phase-difference comparison circuit the reference clock signal and the clock signal, both being out of phase by one cycle with each other, and which outputs a plurality of out-of-phase clock signals;

the charge pump circuit includes:
a first input node for receiving the UP signal from said phase-difference comparison circuit;
a second input node for receiving the DOWN signal from said phase-difference comparison circuit;
an output node connected to an input node of said low-pass filter;
a first MOS transistor having a first conductivity type which is connected at the gate electrode thereof to said first input node and at the source electrode thereof to a supply voltage node having a supply voltage applied thereto;
a second MOS transistor having the first conductivity type which receives at the gate electrode thereof an electric potential and which is connected between the drain electrode of said first MOS transistor and said output node;
a third MOS transistor having the first conductivity type which is connected at the gate electrode thereof to said second input node and at the source electrode thereof to said supply voltage node;
a fourth MOS transistor having the first conductivity type which is connected at the gate electrode thereof to the gate electrode of said second MOS transistor and at the source electrode thereof to the drain electrode of said third MOS transistor; and
a current mirror circuit having input circuitry which is connected to the drain electrode of said fourth MOS transistor and through which an input current flows, as well as output circuitry which is connected to said output node and through which an output current corresponding to the input current flowing through said input circuit flows; and the voltage-controlled oscillation circuit includes:
a voltage control circuit which receives a control voltage from said low-pass filter and which outputs the delay time setting voltage signal to said plurality of selection clock signal generation circuits; and
a plurality of cascaded delay means which are controlled by the delay time setting voltage signal received from said voltage control circuit, wherein the delay means in the first stage receives the frequency-divided clock signal from said frequency division circuit, and two delay means of the plurality of delay means output to said phase-difference comparison circuit, as the reference clock signal and the clock signal, which clock signals are out of phase by one cycle with each other.

* * * * *